United States Patent
Cousinard et al.

(10) Patent No.: US 7,741,928 B1
(45) Date of Patent: Jun. 22, 2010

(54) FREQUENCY MODULATION USING A DIGITAL FREQUENCY LOCKED LOOP

(75) Inventors: David Cousinard, Morges (CH); Philippe Mosch, Le Mont-sur-Lausanne (CH); Lydi Smaini, St. Julien en Genevois (FR); Randy Tsang, Foster City, CA (US); Cao-Thong Tu, Lausanne (CH); Miljan Vuletic, Lausanne (CH)

(73) Assignee: Marvell International Ltd., Hamilton (BM)

( * ) Notice: Subject to any disclaimer, the term of this patent is extended or adjusted under 35 U.S.C. 154(b) by 78 days.

(21) Appl. No.: 12/247,869

(22) Filed: Oct. 8, 2008

Related U.S. Application Data

(60) Provisional application No. 60/978,915, filed on Oct. 10, 2007.

(51) Int. Cl.
*H03C 3/00* (2006.01)
*H03C 3/06* (2006.01)
*H03L 7/06* (2006.01)
*H04B 1/04* (2006.01)

(52) U.S. Cl. .......... 332/127; 331/23; 455/113
(58) Field of Classification Search ........... 332/117, 332/123, 126, 127; 331/1 A, 16–18, 23, 331/25; 455/110–113
See application file for complete search history.

(56) References Cited

U.S. PATENT DOCUMENTS 7,439,817 B2 * 10/2008 Waheed et al. .......... 331/16

\* cited by examiner

*Primary Examiner*—David Mis

(57) ABSTRACT

Circuits and methods for frequency modulation (FM) using a digital frequency-locked loop (DFLL). A digitally controlled oscillator (DCO) generates and adjusts a frequency of a modulated signal based on a digital tuning word. A DFLL control logic circuit receives a feedback of the modulated signal and generates a carrier signal word. A sigma delta modulator circuit receives an input signal and applies dithering to produce a dithered input signal word. An adder circuit receives and sums the dithered input signal word and the carrier signal word to produce the digital tuning word. The DFLL control logic circuit adjusts the carrier signal word to lock a carrier frequency of the modulated signal.

22 Claims, 19 Drawing Sheets

FREQUENCY MODULATION USING A DIGITAL FREQUENCY LOCKED LOOP

CROSS-REFERENCE TO RELATED APPLICATION

This application claims the benefit of U.S. Provisional Patent Application No. 60/978,915, filed Oct. 10, 2007, the contents of which are hereby incorporated by reference as if fully stated herein.

FIELD

The present invention relates to frequency modulation (FM) transmission of an input signal.

BACKGROUND

Conventionally, frequency modulation (FM) transmitters have been designed using analog phase-locked-loops (PLLs) that include voltage controlled oscillators (VCOs). FIG. 1 is a block diagram of a conventional PLL 80. PLL 80 includes phase detector 70, charge pump 71, lowpass filter 72, VCO 1, and feedback divider circuit 73.

VCO 1 receives control voltage 4 and input signal 90 and generates output signal 75. Feedback divider circuit 73 receives a feedback of output signal 75 and generates divided carrier signal 77. Phase detector 70 receives divided carrier signal 77 and reference clock signal 74 and generates phase difference 78. Charge pump 71 receives phase difference 78 and generates charged phase difference 79. In one example, charge pump 71 transforms phase difference 78 into two signals—commonly referred to as an UP and DOWN controlling switches—to steer current into (or out of) a capacitor to generate a voltage having an average value (i.e., duty cycle) that is proportional to phase difference 78. Lowpass filter 72 receives charged phase difference 79 and generates control voltage 4.

Phase detector 70 compares reference signal 74 and divided output signal 77 and adjusts phase difference 78 such that phase difference 78 has frequency components equal to a sum and a difference of a frequency of reference signal 74 and a frequency of divided output signal 77. Low-pass filter 72 attenuates the sum component of charged phase difference 79 but passes difference component of charged phase difference 79 as control voltage 4. In one aspect, low-pass filter 72 attenuates the high frequency components of the charge pump output to generate control voltage 4. Control voltage 4 controls VCO 1, thereby setting a frequency of output signal 75.

Because lowpass filter 72 attenuates the sum component of charged phase difference 79, only the difference component will be present in control voltage 4, which sets the frequency of output signal 75. Control voltage 4 therefore is proportional to the difference in phase between reference signal 74 and divided carrier signal 77. As such, control voltage 4 will adjust a frequency of output signal 75 such that the frequency of output signal 75 moves closer to a frequency of reference signal 74. Thus, PLL 80 locks the frequency of output signal 75 to the frequency of reference signal 74.

Input signal 90 may be applied to modulate the frequency of output signal 75. That is, input signal 90 may further control VCO 1 such that the frequency of output signal 75 varies according to the input signal within a range around the frequency of reference signal 74.

FIG. 2 shows VCO 1 in more detail. VCO 1 includes varactor 3 connected in parallel with inductor 5. DC control voltage 4 is adjusted to control a capacitance of varactor 3. The capacitance of varactor 3 determines the frequency of output signal 75. Specifically, as the capacitance of varactor 3 increases, the frequency of output signal 75 decreases. Alternatively, as the capacitance of varactor 3 decreases, the frequency of output signal 75 increases.

SUMMARY

Analog PLL FM transmitters have several shortcomings. Typically, the feedback of the output signal is divided using the frequency divider before reaching the phase detector of the PLL. Where the frequency of the reference signal is low, a divisor value of the feedback divider may be high, and therefore in-band phase noise is increased and non-negligible degradation of signal-to-noise ration (SNR) occurs. Moreover, the low pass filter of the typical PLL occupies non-negligible area on a chip. In addition, the phase detector and charge pump of the typical PLL may occupy non-negligible area on a chip. Finally, because PLL FM transmitters are analog devices, they do not scale well with nanometer CMOS technology.

In some implementations, in FM transmission, it might not be necessary to track the reference phase. Rather, it may be sufficient to track the reference frequency using a frequency-locked loop. Thus, according to one aspect described herein, FM transmission uses fully digital circuitry based on significant modifications to a digital frequency locked loop (DFLL).

One example embodiment provides a circuit for FM transmission of an input signal. The circuit for FM transmission includes a digitally controlled oscillator (DCO), a digital frequency-locked-loop (DFLL) control logic circuit, a sigma delta modulator circuit, and an adder circuit. The DCO outputs a modulated signal whose frequency is controlled by a digital tuning word. The DFLL control logic circuit generates a carrier signal word based on a feedback of the modulated signal such that a carrier frequency of the modulated signal is locked. The sigma delta modulator circuit dithers the input signal to generate a dithered input signal word. The adder circuit sums the carrier signal word and the dithered input signal word to generate the digital tuning word.

By virtue of the use of a DFLL, an analog low pass filter is ordinarily not required and an area occupied on a chip may be reduced. By virtue of tracking frequency rather than phase, phase noise is not significantly amplified and signal-to-noise ration (SNR) may be improved. By virtue of the use of a frequency counter circuit, a carrier frequency can typically be locked without injecting modulation compensation into the loop. Furthermore, by virtue of fully digital circuitry, the FM transmitter circuit may be directly scalable with nanometer CMOS technology.

In example embodiments, the DFLL control logic circuit includes a carrier signal control logic circuit, a feedback divider circuit, a reference divider circuit, a frequency counter circuit, and a comparison circuit. The carrier signal control logic circuit generates a carrier signal word. The feedback divider circuit receives the feedback of the modulated signal and outputs a divided modulated signal. The reference divider circuit receives a reference clock signal and outputs a divided clock signal. The frequency counter circuit receives the divided modulated signal and the divided clock signal, counts a number of clock cycles of the divided modulated signal during a fixed period determined by the divided clock signal, and outputs the counted number of clock cycles. The comparison circuit compares the counted number of clock cycles to a predetermined number of clock cycles and outputs a carrier frequency error. The carrier signal control logic circuit is constructed to receive the carrier frequency error, and to adjust the carrier signal word based on the received carrier frequency error, so that a carrier frequency of the modulated signal is locked.

The DCO includes a large number of varactors connected in parallel with an inductor, and the varactors are controlled by the digital tuning word.

The feedback divider circuit is a frequency divider, and the divided modulated signal has a frequency equal to a frequency of the modulated signal divided by a feedback divisor of the feedback divider circuit.

The reference divider circuit is a frequency divider, and the divided clock signal has a frequency equal to a frequency of the clock signal divided by a reference divisor of the reference divider circuit.

The comparison circuit receives an output frequency control word that specifies the predetermined number of clock cycles.

The circuit for FM transmission can be constructed on a nanometer CMOS chip.

In other example embodiments, a circuit for FM transmission comprises a digitally controlled oscillator (DCO), a carrier signal control logic circuit, an LSB adder circuit, a sigma delta modulator circuit, an adder circuit, a feedback divider circuit, a reference divider circuit, a frequency counter circuit, and a comparison circuit. The DCO outputs a modulated signal whose frequency is controlled by a digital tuning word. The carrier signal control logic circuit generates a carrier signal word having most significant bits (MSB) and least significant bits (LSB). The LSB adder circuit sums the LSB and the input signal to generate an LSB-input signal. The sigma delta modulator circuit dithers the LSB-input signal to generate a dithered input signal word. The adder circuit sums the MSB and the dithered input signal word to generate the digital tuning word. The feedback divider circuit receives a feedback of the modulated signal and outputs a divided modulated signal. The reference divider circuit receives a reference clock signal and outputs a divided clock signal. The frequency counter circuit receives the divided modulated signal and the divided clock signal, counts a number of clock cycles of the divided modulated signal during a fixed period determined by the divided clock signal, and outputs the counted number of clock cycles. The comparison circuit compares the counted number of clock cycles to a predetermined number of clock cycles and outputs a carrier frequency error. The carrier signal control logic circuit is constructed to receive the carrier frequency error and to adjust the carrier signal word based on the received carrier frequency error, such that a carrier frequency of the modulated signal is locked.

By virtue of dithering an LSB of a carrier signal word, a minimum frequency step of a carrier frequency is not necessarily limited by a minimum frequency step of a DCO. By virtue of the use of a DFLL, an analog low pass filter is ordinarily not required and an area occupied on a chip may be reduced. By virtue of tracking frequency rather than phase, phase noise is not significantly amplified and signal-to-noise ration (SNR) may be improved. By virtue of the use of a frequency counter circuit, a carrier frequency can typically be locked without injecting modulation compensation into the loop. Furthermore, by virtue of fully digital circuitry, the FM transmitter circuit may be directly scalable with nanometer CMOS technology.

In other example embodiments, a method for FM transmission of an input signal using a DFLL and a DCO is provided. The method includes a signal generating step, a frequency locking controlling step, a sigma delta modulating step, and an adding step. In the signal generating step, a modulated signal whose frequency is controlled by a digital tuning word is output. In the frequency locking controlling step, a carrier signal word is generated and adjusted based on a feedback of the modulated signal such that a carrier frequency of the modulated signal is locked. In the sigma delta modulating step, the input signal is dithered to generate a dithered input signal word. In the adding step, the carrier signal word and the dithered input signal are summed to generate the digital tuning word.

In other example embodiments, a method for FM transmission of an input signal using a DFLL and a DCO is provided. The method includes a signal generating step, a carrier signal controlling step, an LSB adding step, a sigma delta modulating step, an adding step, a feedback dividing step, a reference dividing step, a frequency counting step, and a comparing step. In the signal generating step, a modulated signal whose frequency is controlled by a digital tuning word is output. In the carrier signal controlling step, a carrier signal word having most significant bits (MSB) and least significant bits (LSB) is generated. In the LSB adding step, the LSB and the input signal are summed to generate an LSB-input signal. In the sigma delta modulating step, the LSB-input signal is dithered to generate a dithered input signal word. In the adding step, the MSB and the dithered input signal are summed to generate the digital tuning word. In the feedback dividing step, a feedback of the modulated signal is received and a divided modulated signal is output. In the reference dividing step, a reference clock signal is received and a divided clock signal is output. In the frequency counting step, the divided modulated signal and the divided clock signal are received, a number of clock cycles of the divided modulated signal during a fixed period determined by the divided clock signal is counted, and the counted number of clock cycles is output. In the comparing step, the counted number of clock cycles is compared to a predetermined number of clock cycles, and a carrier frequency error is output. The carrier signal controlling step adjusts the carrier signal word based on the carrier frequency error, such that a carrier frequency of the modulated signal is locked.

A more complete understanding of the disclosure can be obtained by reference to the following detailed description in connection with the attached drawings.

DETAILED DESCRIPTION

As used in the following description, "word" is defined to be a value represented in a digital format which includes multiple bits.

Before describing example embodiments of the invention, a conventional digital frequency-locked loop (DFLL) will first be described. It should be understood that the example embodiments are not conventional DFLLs, but rather are significant modifications to conventional DFFLs. Moreover, DFLLs are not known to be applied to FM transmission. Nevertheless, it is thought that a description of a DFLL is helpful.

Figure 1:
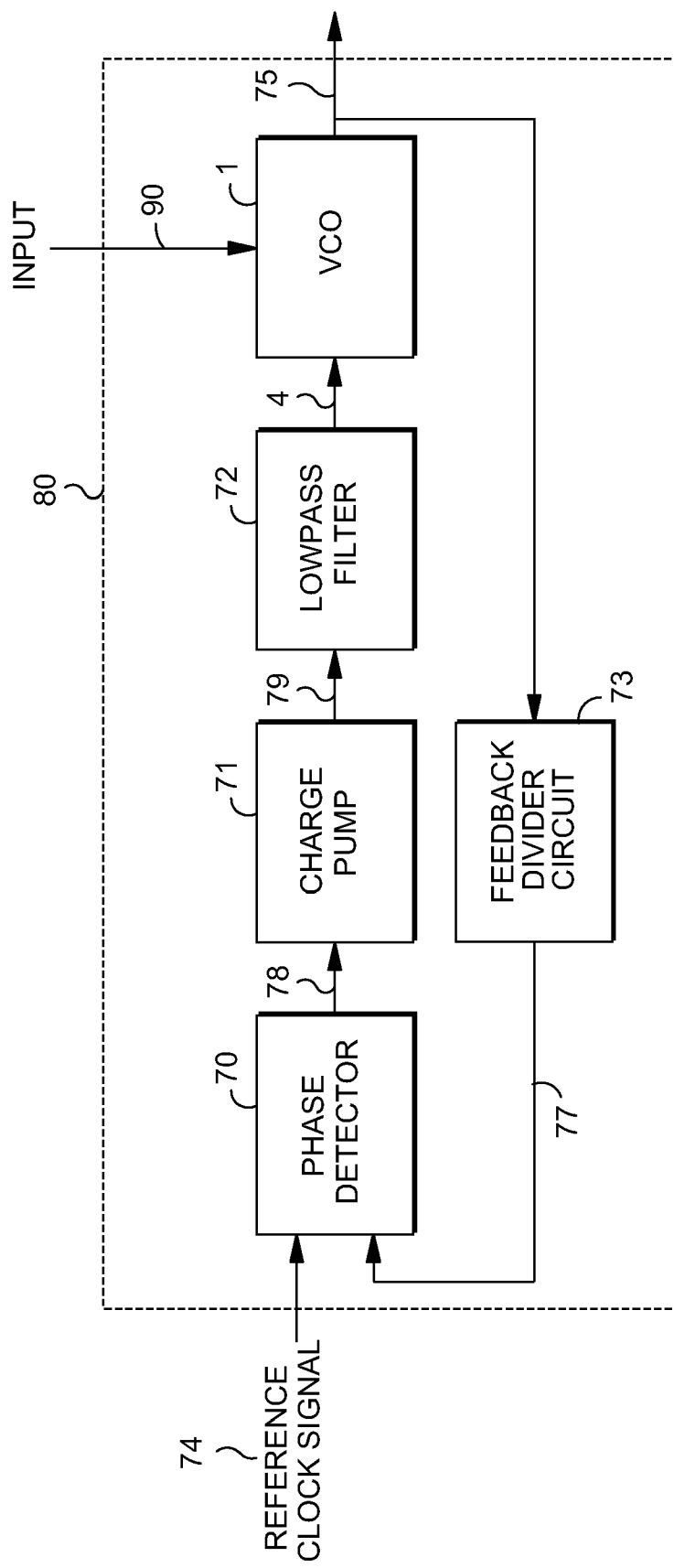
FIG. 1 is a block diagram of a phase-locked loop (PLL).
Figure 2:
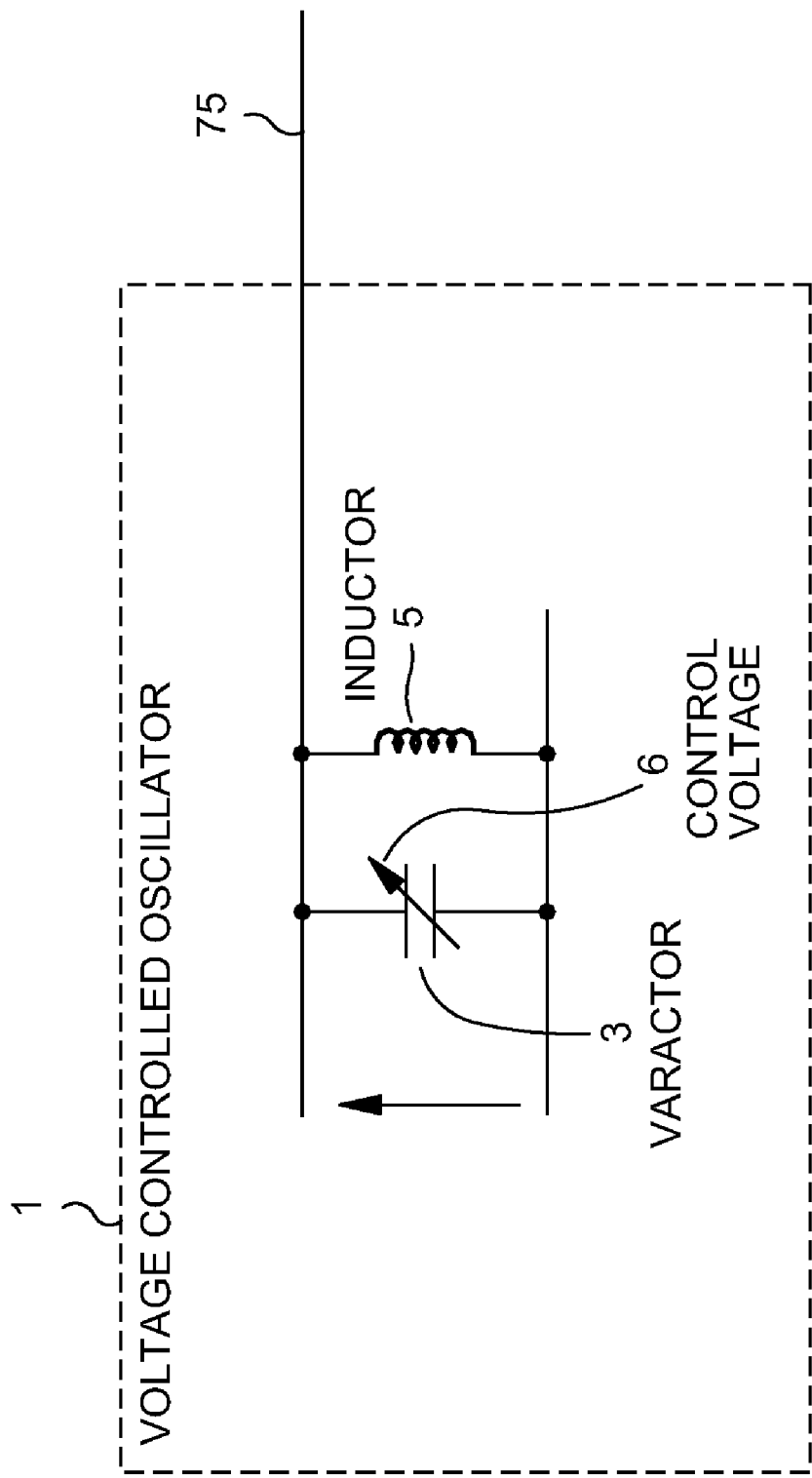
FIG. 2 is a diagram of the voltage controlled oscillator (VCO) of FIG. 1.
Figure 3:
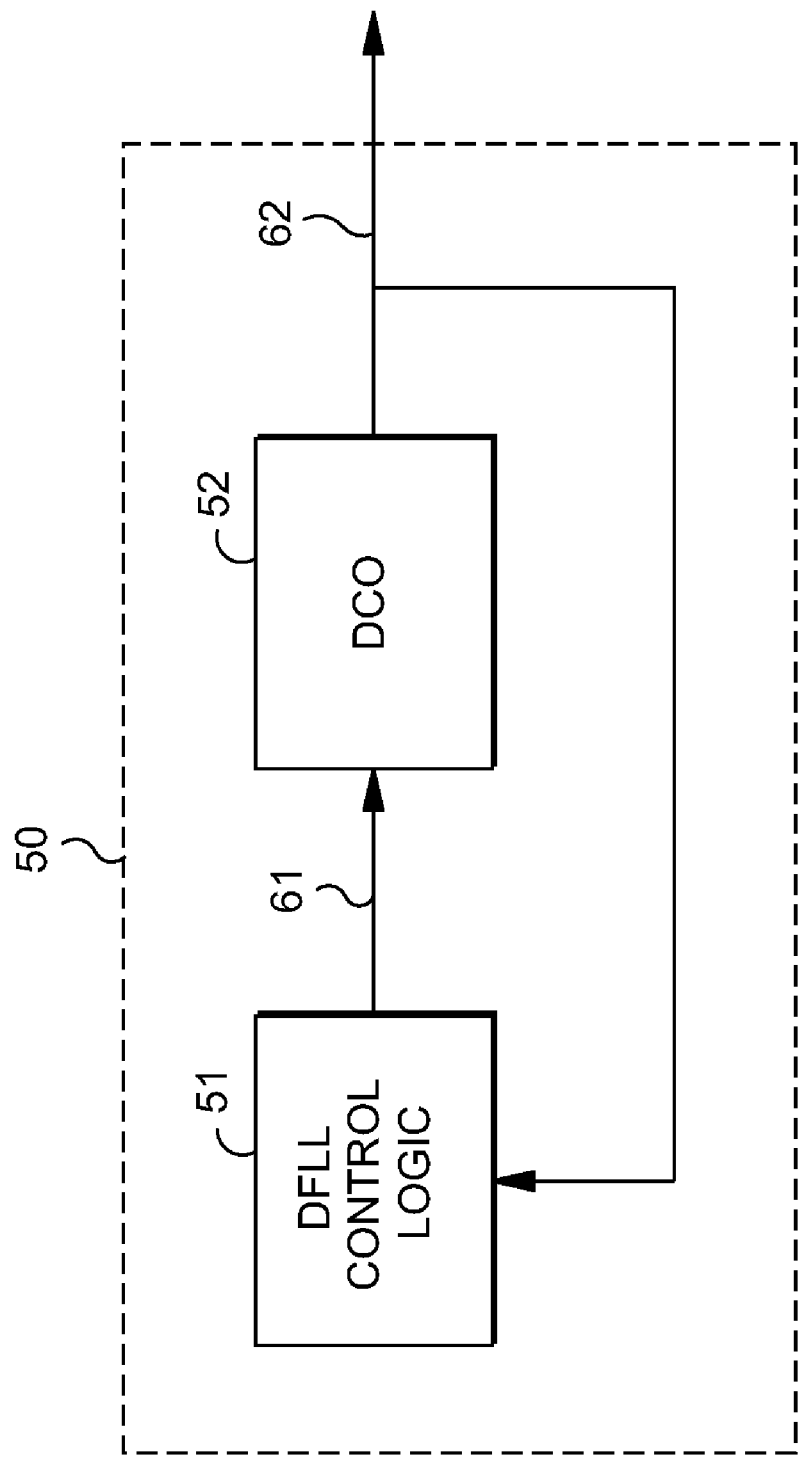
FIG. 3 is a block diagram of a digital frequency-locked loop (DFLL).

FIG. 3 is a block diagram of a conventional DFLL that uses a digitally controlled oscillator (DCO). DFLL 50 includes DFLL control logic circuit 51 and DCO 52. DCO 52 receives carrier signal word 61 as an input and generates carrier signal 62. DFLL control logic circuit 51 receives a feedback of carrier signal 62 and generates carrier signal word 61.

DCO 52 adjusts a frequency of carrier signal 62 based on carrier signal word 61. Based on a frequency of the feedback of carrier signal 62, DFLL control logic circuit 51 adjusts carrier signal word 61 to control DCO 52 such that a carrier frequency of carrier signal 62 is locked.

Figure 4:
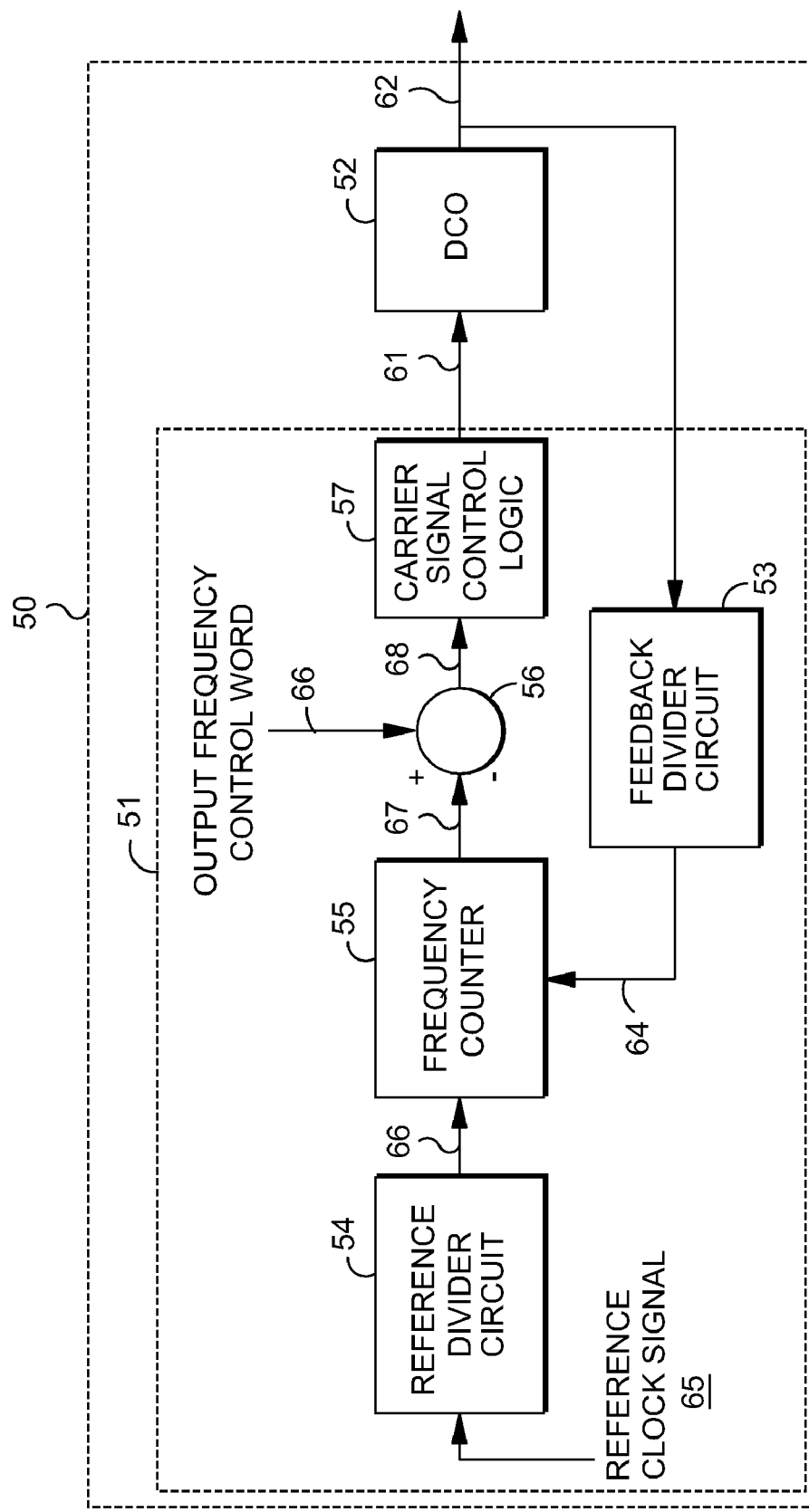
FIG. 4 is a more detailed block diagram of the DFLL of FIG. 3.

FIG. 4 is a more detailed block diagram of DFLL 50. Here, the details of DFLL control logic circuit 51 are shown. DFLL control logic circuit 51 includes reference divider circuit 54, frequency counter circuit 55, carrier signal control logic circuit 57, feedback divider circuit 53, and comparison circuit 56.

Reference divider circuit 54 receives reference clock signal 65 (having a reference frequency) and generates divided clock signal 66. Feedback divider circuit 53 receives a feedback of carrier signal 62 and generates divided carrier signal 64. Frequency counter circuit 55 receives divided clock signal 66 and divided carrier signal 64 and generates counted number of clock cycles 67. Comparison circuit 56 receives counted number of clock cycles 67 and output frequency control word 66, and generates carrier frequency error 68. Carrier signal control logic circuit 57 receives carrier frequency error 68 and generates carrier signal word 61. DCO 52 receives carrier signal word 61 as an input and generates carrier signal 62.

First Embodiment

Figure 5A:
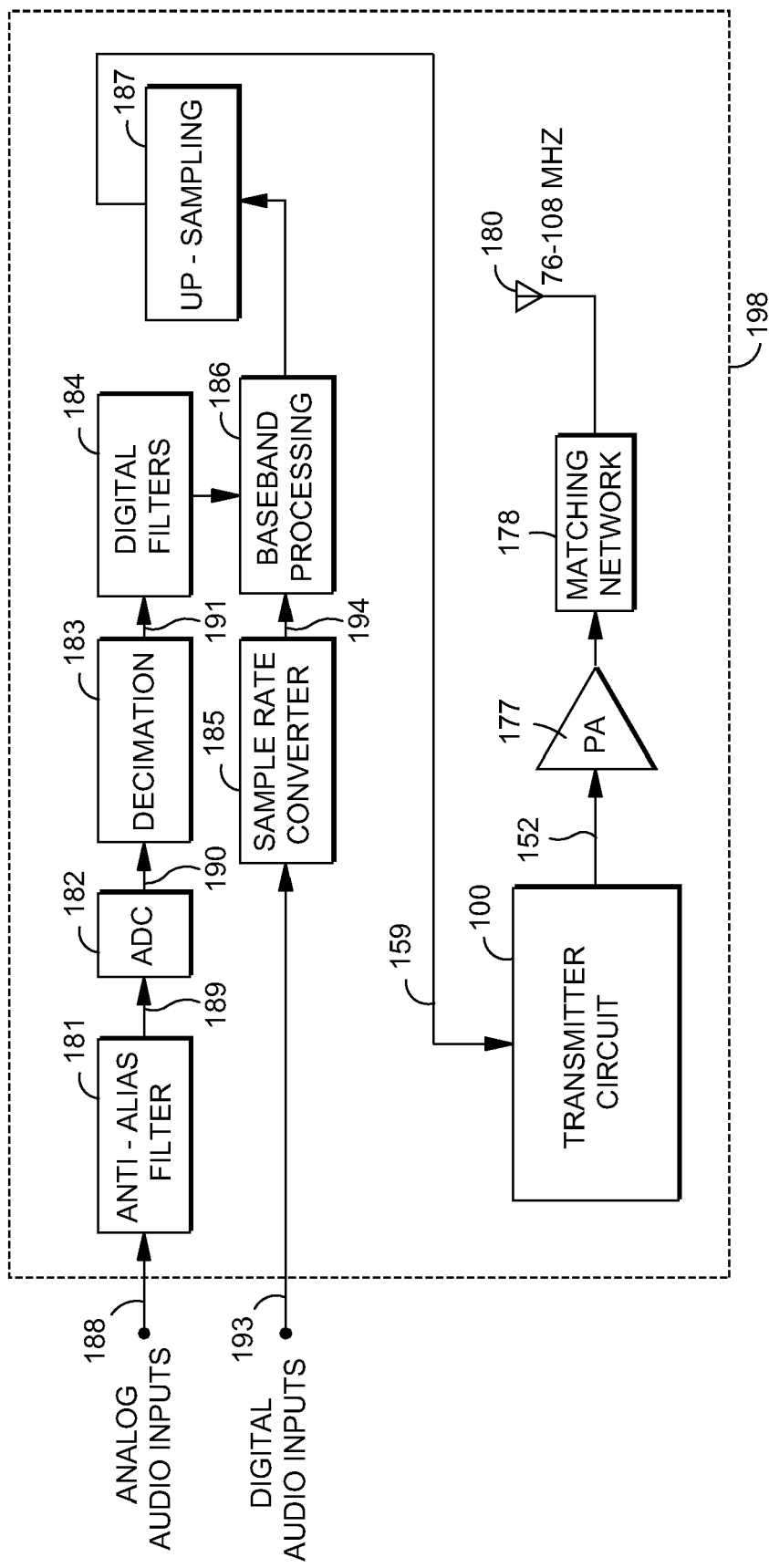
FIG. 5A is a block diagram of an FM transmitter device in accordance with a first example embodiment

FIG. 5A is a block diagram of a FM transmitter device 198, in accordance with a first example embodiment. FM transmitter device 198 includes anti-alias filter 181, analog-to-digital (AD) converter 182, decimation circuit 183, digital filters 184, sample rate converter 185, baseband processing circuit 186, up-sampling circuit 187, FM transmitter circuit 100, power amplifier (PA) 177, matching network 178, and antenna 180.

FM transmitter device 198 receives both analog audio input 188 and digital audio input 193. An analog audio signal input on analog audio input 188 undergoes processing in anti-alias filter 181, AD converter 182, decimation circuit 183, digital filters 184, baseband processing circuit 186, and up-sampling circuit 187 before arriving as input signal 159 at FM transmitter circuit 100. A digital audio signal input on digital audio input 193 undergoes processing in sample rate converter 185, baseband processing circuit 186 and up-sampling circuit 187 before arriving as input signal 159 at FM transmitter circuit 100. Modulated signal 152 is processed by PA 177 and matching network 178 before arriving at antenna 180.

Anti-alias filter 181 restricts the bandwidth of an analog audio signal to a range satisfactory for AD conversion. AD converter 182 converts an analog output 189 of anti-alias filter 181 into a digital signal. Decimation circuit 183 reduces the number of samples in the digital signal 190 output from AD converter 182 and produces decimated signal 191. Digital filters 184 perform various types of processing on decimated signal 191. Sample rate converter 185 changes the sample rate of the signal received at digital audio input 193. If FM transmitter device 198 is operating using an analog input signal, baseband processing circuit 186 shifts the range of frequencies spanned by an output of the digital filters 184 to a range that is more easily processed by FM transmitter circuit 100. If FM transmitter device 198 is operating using a digital input signal, baseband processing circuit 186 shifts the range of frequencies spanned by output 194 of the sample rate converter to a range that is more easily processed by FM transmitter circuit 100. Up-sampling circuit 187 increases the number of samples in an output of baseband processing circuit 186 and performs interpolation on the resulting signal. An output of up-sampling circuit 187 is input signal 159 to FM transmitter circuit 100.

Matching network 178 matches the impedance of PA circuit 177 to the impedance of antenna 180 to maximize power transfer and minimize reflections. Antenna 180 broadcasts an FM signal in the range of 76 MHz to 108 MHz.

Figure 5B:
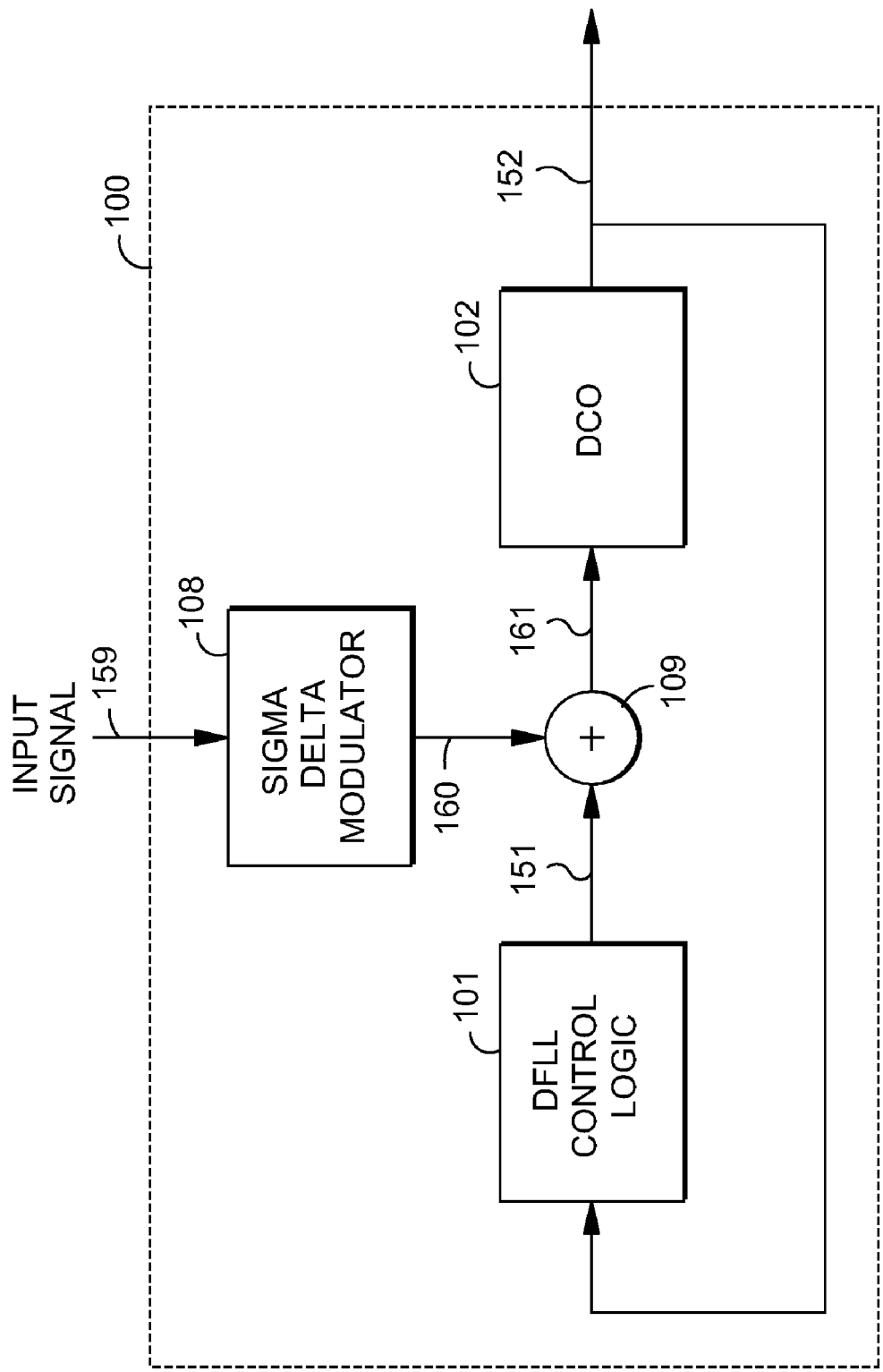
FIG. 5B is a block diagram of the FM transmitter circuit of FIG. 5A.

FIG. 5B is a block diagram of FM transmitter circuit 100 of FIG. 5A. FM transmitter circuit 100 includes DCO 102, DFLL control logic circuit 101, adder circuit 109, and sigma delta modulator circuit 108.

DCO 102 receives digital tuning word 161 as an input and generates modulated signal 152. DFLL control logic circuit 101 receives a feedback of modulated signal 152 as an input and generates carrier signal word 151. Sigma delta modulator circuit 108 receives input signal 159 as an input and generates dithered input signal word 160. Adder circuit 109 receives carrier signal word 151 and dithered input signal word 160 as an input and generates digital tuning word 161.

DCO 102 adjusts a frequency of modulated signal 152 based on digital tuning word 161. If digital tuning word 161 is increased, DCO 102 decreases the frequency of modulated signal 152. If digital tuning word 161 is decreased, DCO 102 increases the frequency of modulated signal 152. Because digital tuning word 161 is the sum of carrier signal word 151 and dithered input signal word 160, modulated signal 152 will include a carrier component and an input-modulated component determined by carrier signal word 151 and dithered input signal word 160, respectively.

DFLL control logic circuit 101 compares a frequency of the feedback of modulated signal 152 to a desired carrier frequency and adjusts carrier signal word 151 accordingly. Specifically, if the frequency of the feedback of modulated signal 152 is below the desired carrier frequency, DFLL control logic circuit 101 decreases carrier signal word 151. If the frequency of the feedback of modulated signal 152 is above the desired carrier frequency, DFLL control logic circuit 101 increases carrier signal word 151. Because carrier signal word 151 determines the carrier component of modulated signal 152, this adjustment locks a frequency of the carrier component of modulated signal 152 to the desired carrier frequency.

Sigma delta modulator circuit 108 dithers the value of input signal word 160 based on the value of input signal 159. This dithering operation is discussed in detail below with reference to FIG. 7. Because input signal word 160 determines an input-modulated component of modulated signal 152, the frequency of modulated signal 152 will vary according to input signal 159 within a range around the locked carrier frequency determined by the carrier signal word 151.

Figure 6:
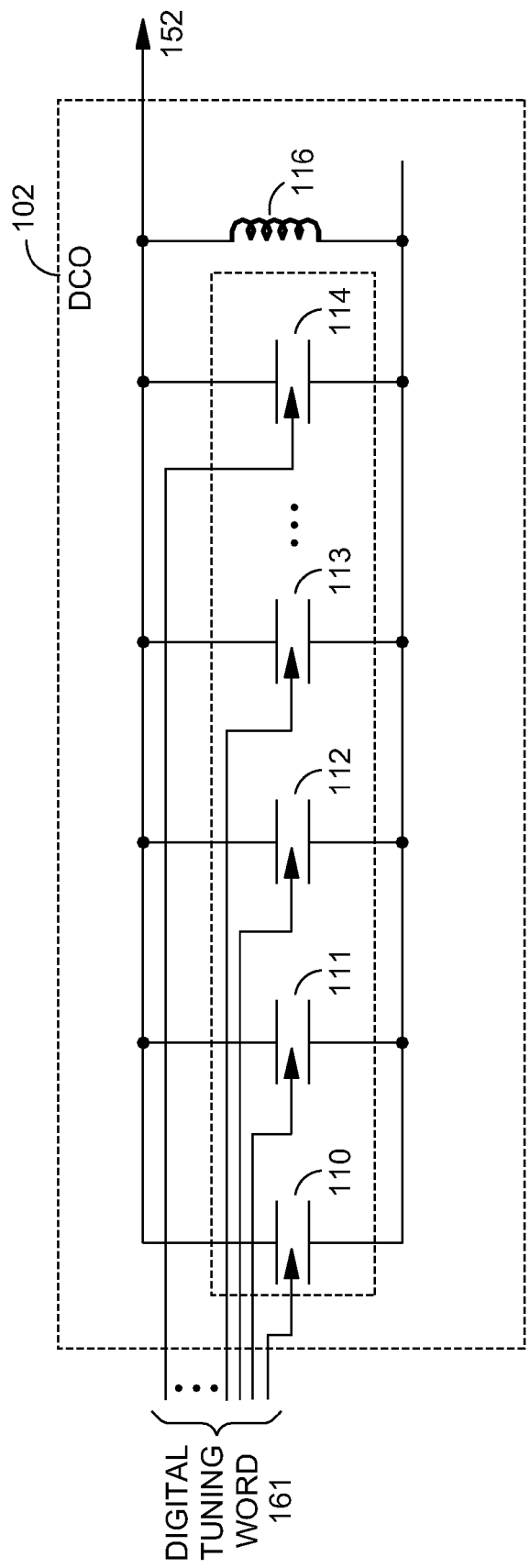
FIG. 6 is a diagram of the digitally controlled oscillator (DCO) of FIG. 5B.

FIG. 6 is a detailed diagram of DCO 102 in accordance with the first embodiment. DCO 102 includes a plurality of binary controlled varactors 110 to 114 connected in parallel with inductor 116.

Each varactor is controlled by a bit of digital tuning word 161. If a bit of digital tuning word 161 is high, a corresponding varactor will be enabled. If a bit of digital tuning word 161 is low, a corresponding varactor will be disabled. By controlling which varactors are enabled and which are disabled, digital tuning word 161 sets a total capacitance of DCO 102. The total capacitance of DCO 102 determines a frequency of modulated signal 152 produced by DCO 102. Thus, DCO 102 uses digital tuning word 161 to control the frequency of modulated signal 152.

For example, if digital tuning word 161 is incremented, additional bits are turned high, the total capacitance of DCO 102 increases and the frequency of modulated signal 152 decreases. Alternatively, if digital tuning word 161 is decremented, additional bits are turned low, the total capacitance of DCO 102 decreases and the frequency of modulated signal 152 increases.

Figure 7:
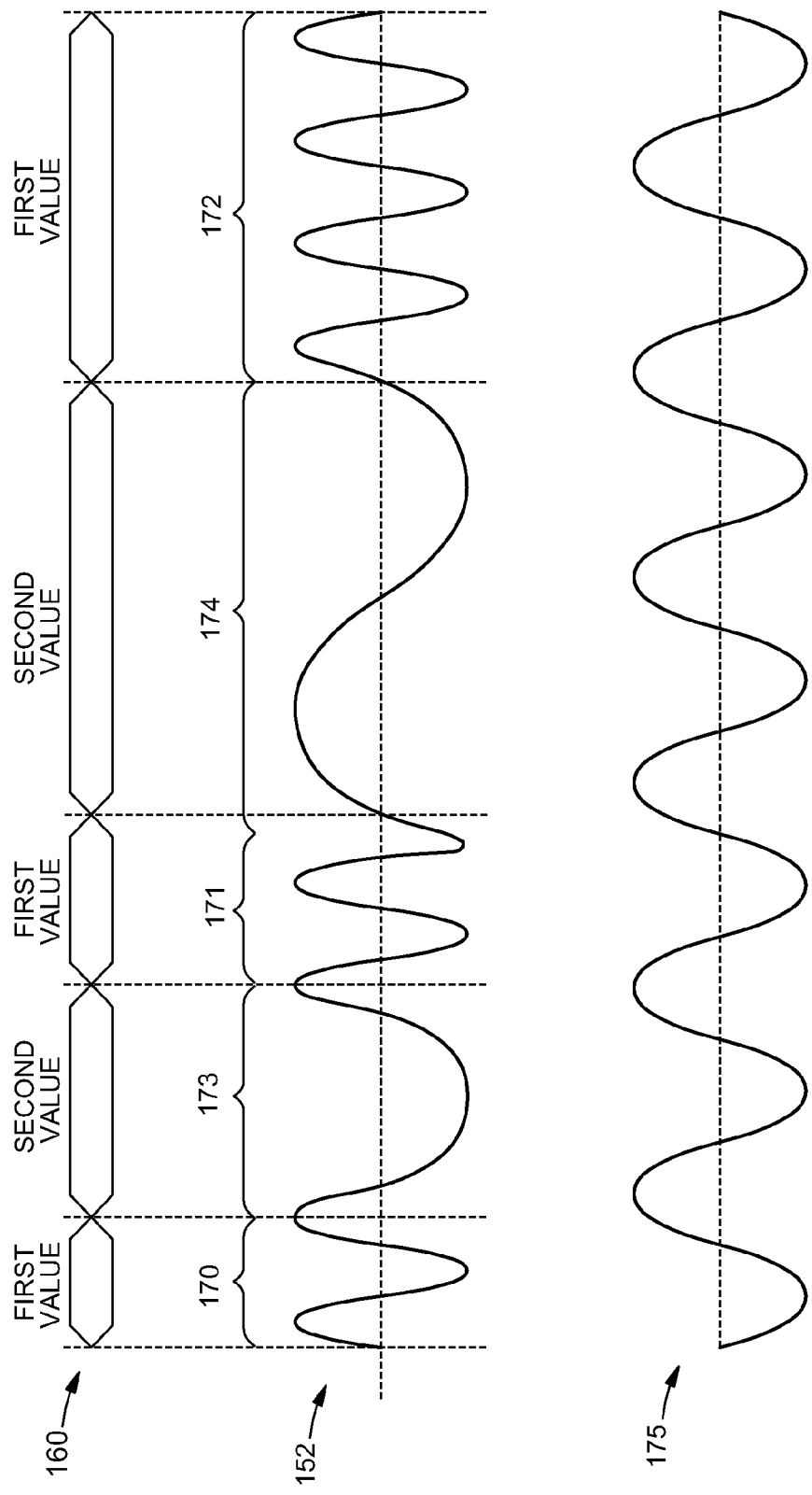
FIG. 7 is an illustration of a dithering operation of a sigma delta modulator circuit in accordance the first example embodiment.

FIG. 7 is an illustration of a dithering operation of sigma delta modulator circuit 108. Because DCO 102 has a finite number of binary controlled varactors, DCO 102 can produce only a finite number of discrete frequencies. Dithering allows the frequency of the input-modulated component of modulated signal 152 to approximate a continuous range of frequencies despite the fact that DCO 102 can only produce a discrete set of frequencies. To accomplish this, sigma delta modulator circuit 108 alternates input signal word 160 between multiple values such that a time-average frequency of modulated signal 152 is between discrete frequencies that DCO 102 can produce.

For example, FIG. 7 depicts sigma delta modulation where a desired frequency of the input-modulated component of modulated signal 152 is halfway between two discrete frequencies that DCO 102 can produce. To approximate the desired frequency, sigma delta modulator circuit 108 sets input signal word 160 to a first value during time periods 170, 171 and 172 and to a second value during time periods 173 and 174. As a result, a frequency of modulated signal 152 is set to the higher of the two possible discrete frequencies during time periods 170, 171 and 172 and a frequency of modulated signal 152 is set to the lower of the two possible discrete frequencies during time periods 173 and 174. Because the sum of lengths of time periods 170, 171 and 172 is equal to the sum of lengths of time periods 173 and 174, the time average of a frequency of the modulated signal is halfway between the two possible discrete frequencies. Furthermore, because the modulated signal alternates between the two possible discrete frequencies very rapidly, the modulated signal approximates perceived modulated signal 175, which has a frequency halfway between the two possible discrete frequencies.

Figure 8:
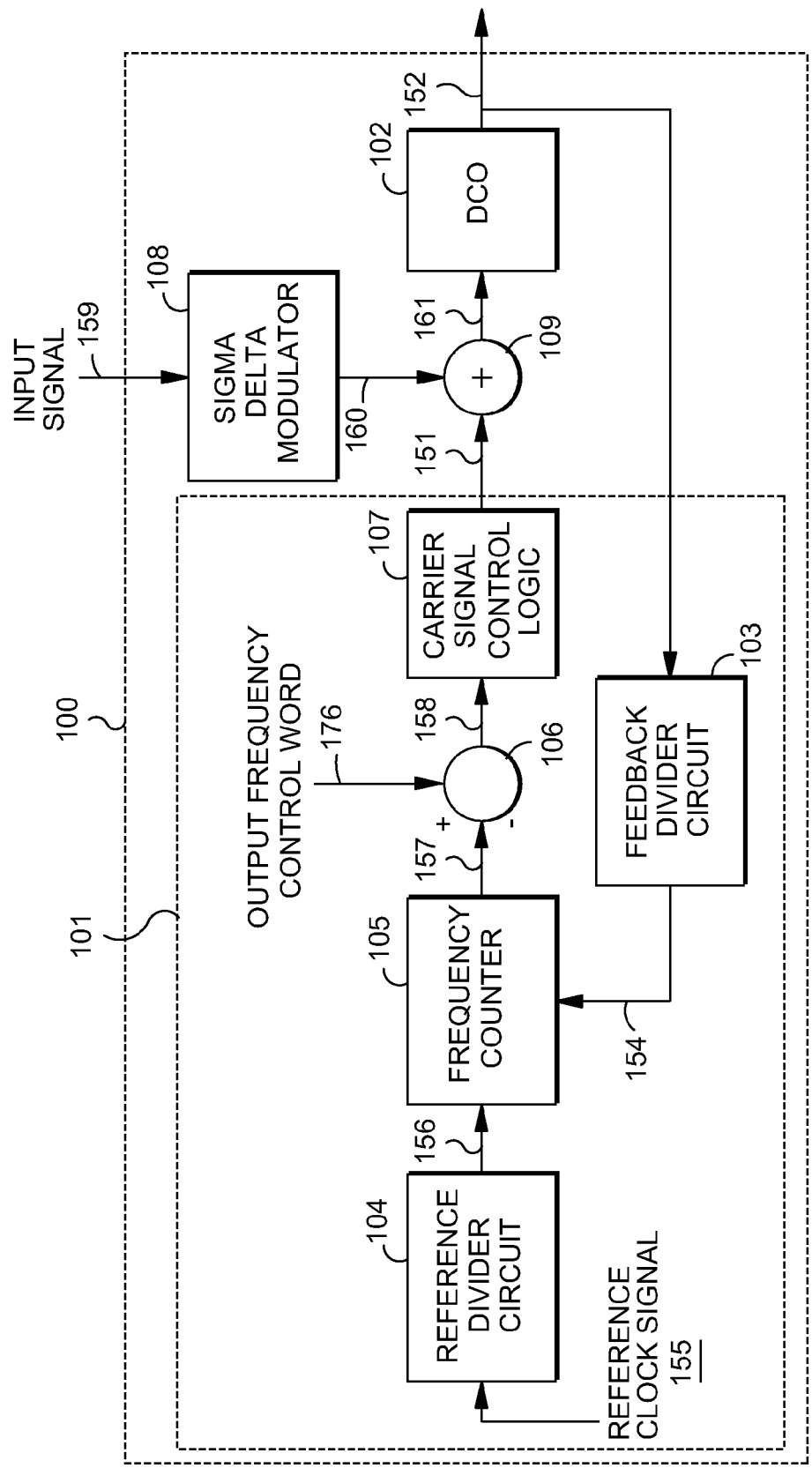
FIG. 8 is a more detailed block diagram of the FM transmitter circuit of FIG. 5B.

FIG. 8 is a block diagram of FM transmitter circuit 100 showing DFLL control logic circuit 101 in more detail. DFLL control logic circuit 101 includes reference divider circuit 104, feedback divider circuit 103, frequency counter circuit 105, comparison circuit 106 and carrier signal control logic circuit 107.

DCO 102 receives digital tuning word 161 as an input and generates modulated signal 152. Feedback divider circuit 103 receives a feedback of modulated signal 152 as an input and generates divided modulated signal 154. Reference divider circuit 104 receives reference clock signal 155 and generates divided clock signal 156. Frequency counter circuit 105 receives divided modulated signal 154 and divided clock signal 156 and generates counted number of clock cycles 157. Comparison circuit 106 receives counted number of clock cycles 157 and output frequency control word 176, and generates carrier frequency error 158. Carrier signal control logic circuit 107 receives carrier frequency error 158 and produces carrier signal word 151. Sigma delta modulator circuit 108 receives input signal 159 as an input and generates dithered input signal word 160. Adder circuit 109 receives carrier signal word 151 and dithered input signal word 160 as an input, and generates digital tuning word 161.

Adder circuit 109 sums carrier signal word 151 and dithered input signal word 160 to generate digital tuning word 161.

DCO 102 adjusts a frequency of modulated signal 152 based on digital tuning word 161. If digital tuning word 161 is increased, DCO 102 decreases the frequency of modulated signal 152. If digital tuning word 161 is decreased, DCO 102 increases the frequency of modulated signal 152. Because digital tuning word 161 is the sum of carrier signal word 151 and dithered input signal word 160, modulated signal 152 will include a carrier component and an input-modulated component determined by carrier signal word 151 and dithered input signal word 160, respectively.

Reference divider circuit 104 is a frequency divider circuit, and a frequency of divided clock signal 156 is equal to a frequency of reference clock signal 155 divided by a reference divisor of reference divider circuit 104.

Feedback divider circuit 103 is a frequency divider circuit, and a frequency of divided modulated signal 154 is equal to a frequency of modulated signal 152 divided by a feedback divisor of feedback divider circuit 103.

Frequency counter circuit 105 determines counted number of clock cycles 157 by counting a number of periods of divided modulated signal 154 counted within a fixed period. The fixed period is determined by divided clock signal 156 and is equal to one period of divided clock signal 156. In other embodiments, the fixed period may be equal to a multiple of the period of divided clock signal 156.

Comparison circuit 106 generates carrier frequency error 158 by taking the difference of counted number of clock cycles 157 and a predetermined number of clock cycles. The predetermined number of clock cycles is set by output frequency control word 176.

Carrier signal control logic circuit 107 adjusts carrier signal word 151 based on carrier frequency error 158 such that the carrier component of modulated signal 152 is set to a desired carrier frequency. Specifically, if carrier frequency error 158 is positive, carrier signal control logic circuit 107 increases carrier signal word 151. If carrier frequency error 158 is negative, carrier signal control logic circuit 107 decreases carrier signal word 151. Because carrier signal word 151 determines the carrier component of modulated signal 152, this adjustment locks a frequency of the carrier component of modulated signal 152 to the desired carrier frequency.

Sigma delta modulator circuit 108 dithers the value of input signal word 160 based on the value of input signal 159. This dithering operation is discussed in detail above with reference to FIG. 7. Because input signal word 160 determines an input-modulated component of modulated signal 152, the frequency of modulated signal 152 varies according to input signal 159 within a range around the locked carrier frequency specified by the carrier signal word 151.

Figure 9:
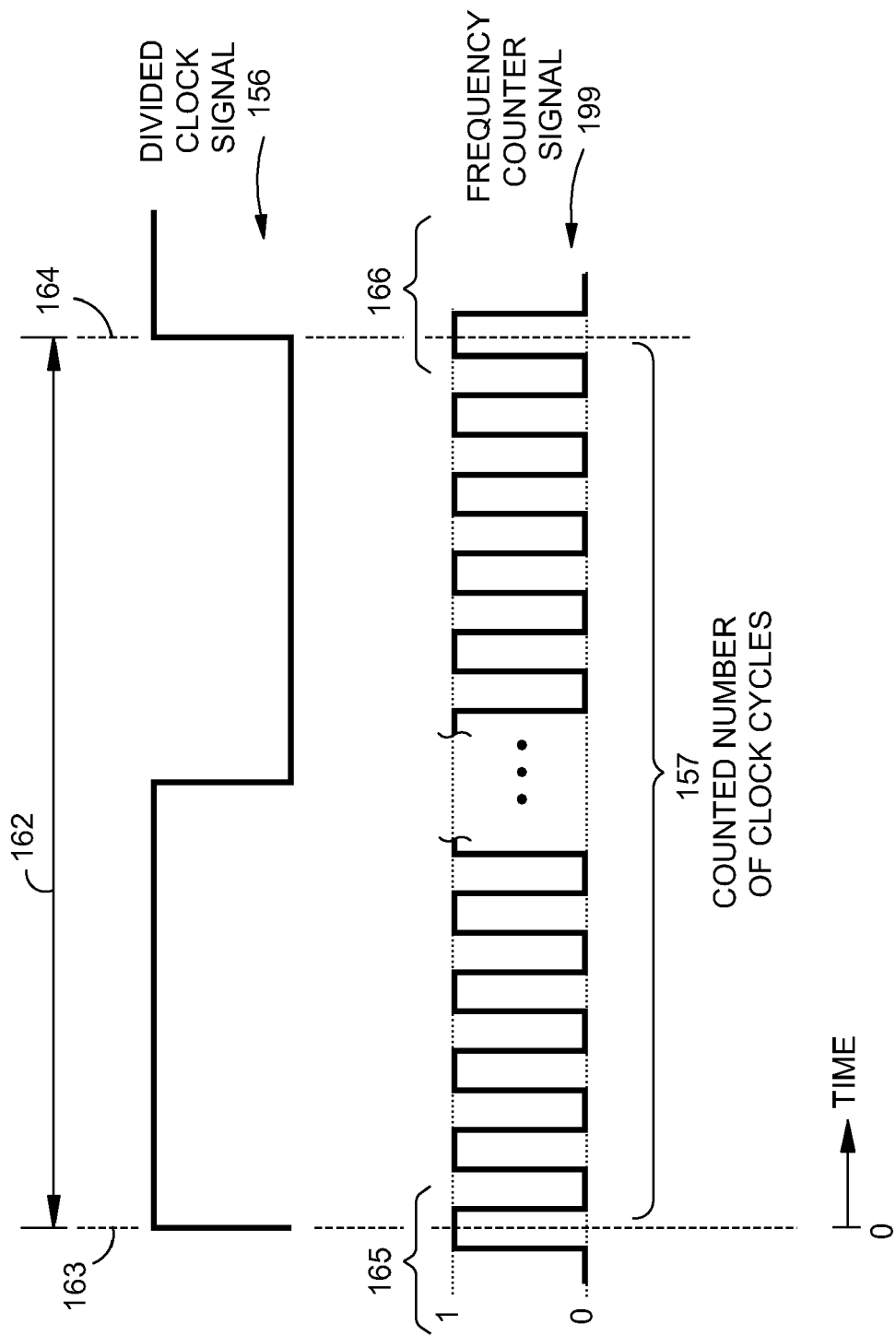
FIG. 9 is an illustration of a frequency counting operation of a frequency counter circuit in accordance with the first example embodiment.

FIG. 9 is an illustration of a frequency counting operation of frequency counter circuit 105 in accordance with the first embodiment. Divided clock signal 156 and divided modulated signal 154 are received by frequency counter circuit 105. Frequency counter circuit 105 generates digital frequency counter signal 199 from divided modulated signal 154 such that digital frequency counter signal 199 has a peak for every peak in divided modulated signal 154. Fixed period 162 begins at the start of the period (time 163) of divided clock signal 156 and ends at the end of the period (time 164) of divided clock signal 156. Frequency counter circuit 105 counts the number of peaks of digital frequency counter signal 199 during fixed period 162 to determine counted number of clock cycles 157.

Because digital frequency counter signal 199 and divided clock signal 156 are not synchronized with each other, it is possible that there will be first uncounted period 165 at start time 163 and second uncounted period 166 at end time 164. This limits the precision of the frequency counter circuit to two periods of the frequency counter signal 199. The precision of the frequency counter circuit can be increased by increasing the value of the reference divisor of reference divider circuit 104. This is because increasing the reference divisor will decrease the frequency of divided clock signal 156 and will increase the length of fixed period 162. As such, counted number of clock cycles 157 will increase and the two periods of potential error (165 and 166) will become relatively less significant.

Figure 10:
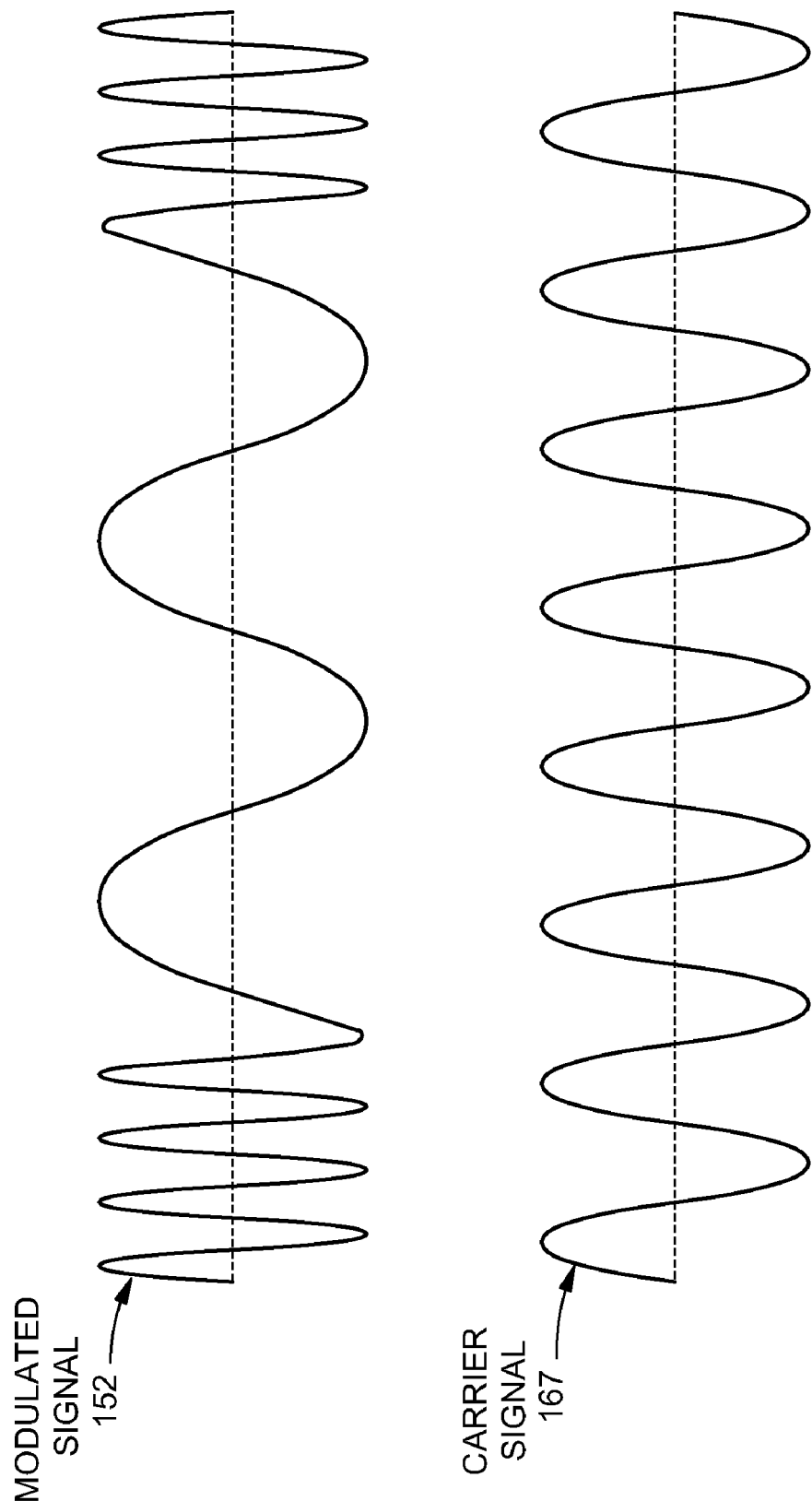
FIG. 10 is an illustration of an integration operation of a frequency counter circuit in accordance with the first example embodiment.

FIG. 10 is an illustration of an integration operation of frequency counter circuit 105 in accordance with the first embodiment. Modulated signal 152 has a frequency that varies according to input signal 159. Carrier signal 167 represents the locked carrier component of modulated signal 152 that is determined by carrier signal control logic circuit 107. That is, the frequency of modulated signal 152 varies according to input signal 159 within a range around the frequency of the locked carrier component.

Although frequency counter circuit 105 receives divided modulated signal 154, which includes both the carrier component and the input-modulated component, frequency counter circuit 105 can still estimate the number of periods of the carrier component in a fixed period. This is because an average frequency of modulated signal 152 is substantially equal to a frequency of the carrier component of modulated signal 152. That is, during a fixed period, the frequency of modulated signal 152 will be higher than the frequency of the carrier component at times, and lower than the frequency of the carrier component at times. However, the high frequency portions and the low frequency portions average out, and a total number of peaks in the modulated signal during a fixed period of time is substantially equal to the number of peaks in the carrier component during the fixed period of time. For example, as shown in FIG. 10, carrier signal 167 has eight total peaks, and modulated signal 152 has 9.5 total peaks, despite the fact that the frequency of modulated signal 152 varies while a frequency of carrier signal 167 is constant.

As the length of the fixed period increases, there will be more time for the high frequency portions and the low frequency portions of modulated signal 152 to average out. Therefore, increasing the size of the reference divisor, and thereby increasing the length of the fixed period, may improve the accuracy of the frequency lock of the DFLL.

Second Embodiment

Figure 11A:
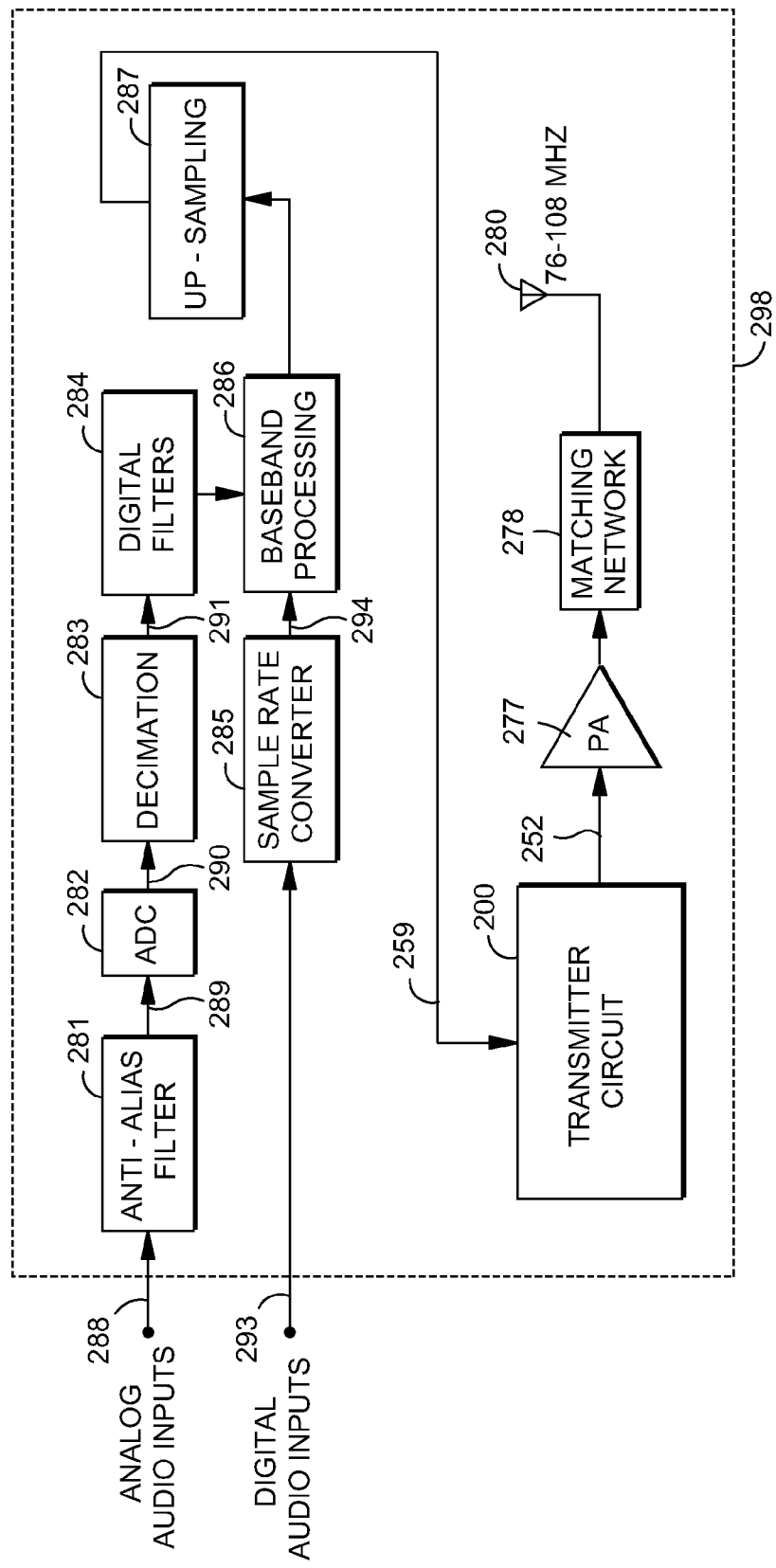
FIG. 11A is a block diagram of an FM transmitter device with LSB dithering in accordance with a second example embodiment

FIG. 11A is a block diagram of a FM transmitter device 298 with LSB dithering, in accordance with a second example embodiment. FM transmitter device 298 includes anti-alias filter 281, analog-to-digital (AD) converter 282, decimation circuit 283, digital filters 284, sample rate converter 285, baseband processing circuit 286, up-sampling circuit 287, FM transmitter circuit 200, power amplifier (PA) 277, matching network 278, and antenna 280.

FM transmitter device 298 receives both analog audio input 288 and digital audio input 293. An analog audio signal input on analog audio input 288 undergoes processing in anti-alias filter 281, AD converter 282, decimation circuit 283, digital filters 284, baseband processing circuit 286, and up-sampling circuit 287 before arriving as input signal 259 at FM transmitter circuit 200. A digital audio signal input on digital audio input 293 undergoes processing in sample rate converter 285, baseband processing circuit 286 and up-sampling circuit 287 before arriving as input signal 259 at FM transmitter circuit 200. Modulated signal 252 is processed by PA 277 and matching network 278 before arriving at antenna 280.

Anti-alias filter 281 restricts the bandwidth of an analog audio signal to a range satisfactory for AD conversion. AD converter 282 converts an analog output 289 of anti-alias filter 281 into a digital signal. Decimation circuit 283 reduces the number of samples in the digital signal 290 output from AD converter 282 and produces decimated signal 291. Digital filters 284 perform various types of processing on decimated signal 291. Sample rate converter 285 changes the sample rate of the signal received at digital audio input 293. If FM transmitter device 298 is operating using an analog input signal, baseband processing circuit 286 shifts the range of frequencies spanned by an output of the digital filters 284 to a range that is more easily processed by FM transmitter circuit 200. If FM transmitter device 298 is operating using a digital input signal, baseband processing circuit 286 shifts the range of frequencies spanned by output 294 of the sample rate converter to a range that is more easily processed by FM transmitter circuit 200. Up-sampling circuit 287 increases the number of samples in an output of baseband processing circuit 286 and performs interpolation on the resulting signal. An output of up-sampling circuit 287 is input signal 259 to FM transmitter circuit 200.

Matching network 278 matches the impedance of PA circuit 277 to the impedance of antenna 280 to maximize power transfer and minimize reflections. Antenna 280 broadcasts an FM signal in the range of 76 MHz to 108 MHz.

Figure 11B:
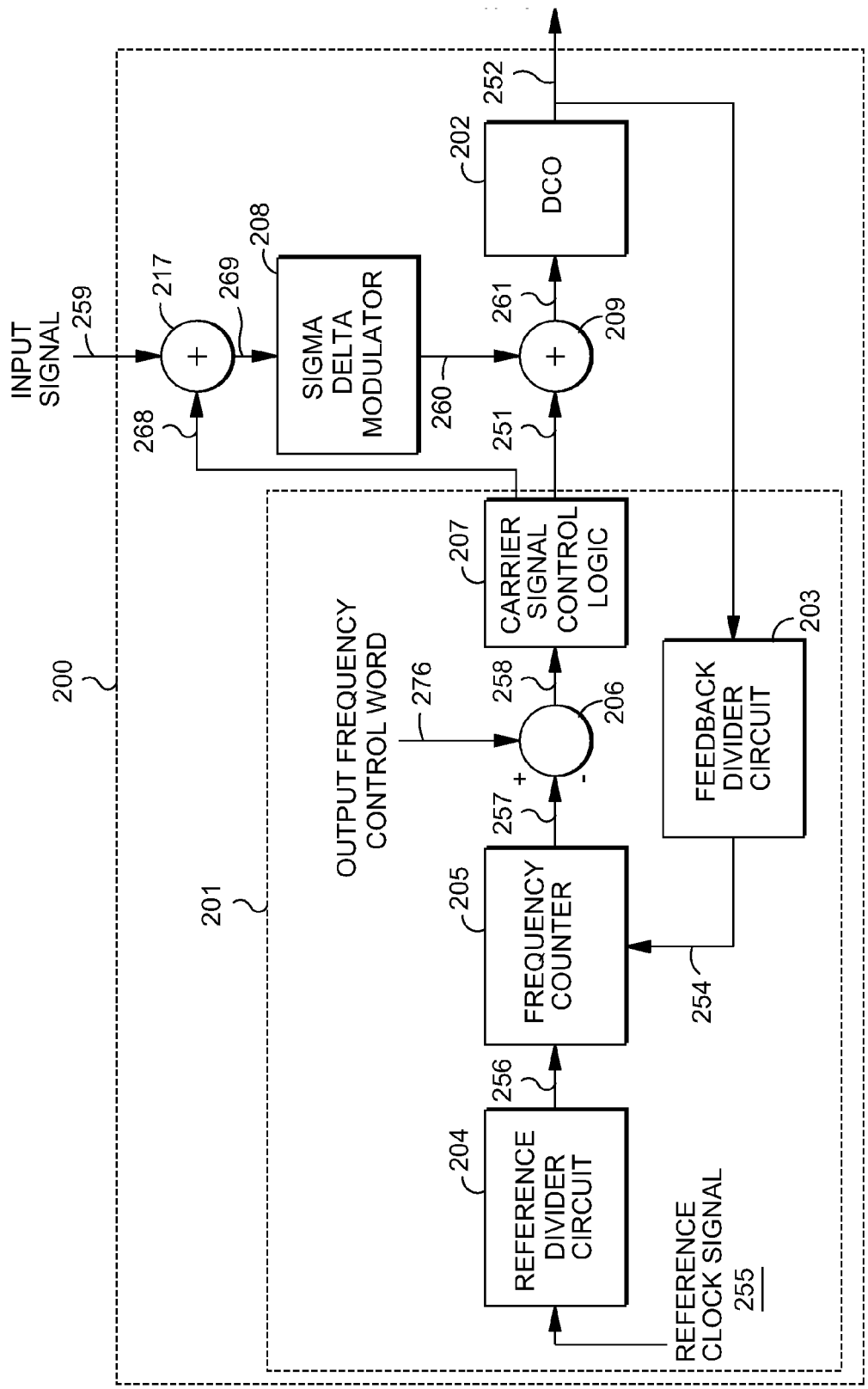
FIG. 11B is a block diagram of the FM transmitter circuit of FIG. 11A.

FIG. 11B is a block diagram of FM transmitter circuit 200 of FIG. 11A. FM transmitter circuit 200 includes DCO 202, DFLL control logic circuit 201, adder circuit 209, LSB adder circuit 217 and sigma delta modulator circuit 208. DFLL control logic circuit 201 includes reference divider circuit 204, feedback divider circuit 203, frequency counter circuit 205, comparison circuit 206 and carrier signal control logic circuit 207.

DCO 202 receives digital tuning word 261 as an input and generates modulated signal 252. Feedback divider circuit 203 receives a feedback of modulated signal 252 as an input and generates divided modulated signal 254. Reference divider circuit 204 receives reference clock signal 255 and generates divided clock signal 256. Frequency counter circuit 205 receives divided modulated signal 254 and divided clock signal 256, and generates counted number of clock cycles 257. Comparison circuit 206 receives counted number of clock cycles 257 and output frequency control word 276, and generates carrier frequency error 258. Carrier signal control logic circuit 207 receives carrier frequency error 258 and generates a carrier signal word having most significant bits (MSB) 251 and least significant bits (LSB) 268. LSB adder circuit 217 receives input signal 259 and LSB 268 and generates LSB-input signal 269. Sigma delta modulator circuit 208 receives LSB-input signal 269 as an input and generates dithered input signal word 260. Adder circuit 209 receives MSB 251 and dithered LSB-input signal word 260 as an input, and generates digital tuning word 261.

Adder circuit 209 sums MSB 251 (of the carrier signal word) and dithered LSB-input signal word 260 to generate digital tuning word 261.

DCO 202 is similar to DCO 102 of FIGS. 5, 6 and 8. DCO 202 adjusts a frequency of modulated signal 252 based on digital tuning word 261. If digital tuning word 261 is increased, DCO 202 decreases the frequency of modulated signal 252. If digital tuning word 261 is decreased, DCO 202 increases the frequency of modulated signal 252. Because digital tuning word 261 is the sum of MSB 251 and dithered LSB-input signal word 260, modulated signal 252 will include a carrier component and an input-modulated component determined by MSB 251 and dithered LSB-input signal word 260 respectively.

Reference divider circuit 204 is a frequency divider circuit, and a frequency of divided clock signal 256 is equal to a frequency of reference clock signal 255 divided by a reference divisor of reference divider circuit 204.

Feedback divider circuit 203 is a frequency divider circuit, and a frequency of divided modulated signal 254 is equal to a frequency of modulated signal 152 divided by a feedback divisor of feedback divider circuit 203.

Frequency counter circuit 205 determines counted number of clock cycles 257 by counting a number of periods of divided modulated signal 254 counted within a fixed period. The fixed period is determined by divided clock signal 256 and is equal to one period of divided clock signal 256. In other embodiments, the fixed period may be equal to a multiple of the period of divided clock signal 256.

Comparison circuit 206 generates carrier frequency error 258 by taking the difference of counted number of clock cycles 257 and a predetermined number of clock cycles. The predetermined number of clock cycles is set by output frequency control word 276.

Carrier signal control logic circuit 207 adjusts MSB 251 and LSB 268 based on carrier frequency error 258 such that the carrier component of modulated signal 252 is set to a desired carrier frequency. Specifically, if carrier frequency error 258 is positive, carrier signal control logic circuit 207 increases MSB 251 and/or LSB 268. If carrier frequency error 258 is negative, carrier signal control logic circuit 207 decreases MSB 251 and/or LSB 268. Because the carrier signal word (which includes MSB 251 and LSB 268) determines the carrier component of modulated signal 252, this adjustment locks a frequency of the carrier component of modulated signal 252 to the desired carrier frequency.

Sigma delta modulator circuit 208 dithers the value of dithered LSB-input signal word 260 based on the value of LSB-input signal 269. Because LSB-input signal word 260 determines an input-modulated component of modulated signal 252, the frequency of modulated signal 252 varies according to input signal 259 within a range around the locked carrier frequency determined by MSB 251 and LSB 268.

Sigma delta modulator circuit 208 performs dithering on LSB-input signal 269, which is the sum of the LSB 268 and input signal 259. Therefore, the frequency precision of the carrier component of the modulated signal 252 is increased in the second embodiment. That is, the frequency of the carrier component of modulated signal 252 can be locked to a frequency other than one of the discrete set of frequencies that DCO 202 can produce. The precision of the frequency of the carrier component of modulated signal 252 can be further increased by increasing the number of bits in LSB 268, because this allows for finer tuning of sigma delta modulator circuit 208. More specifically, by increasing the number of bits in LSB 268, sigma delta modulator circuit 208 can cause DCO 202 to approximate an increased number of frequencies between the discrete frequencies DCO 202 can normally produce.

Figure 12:
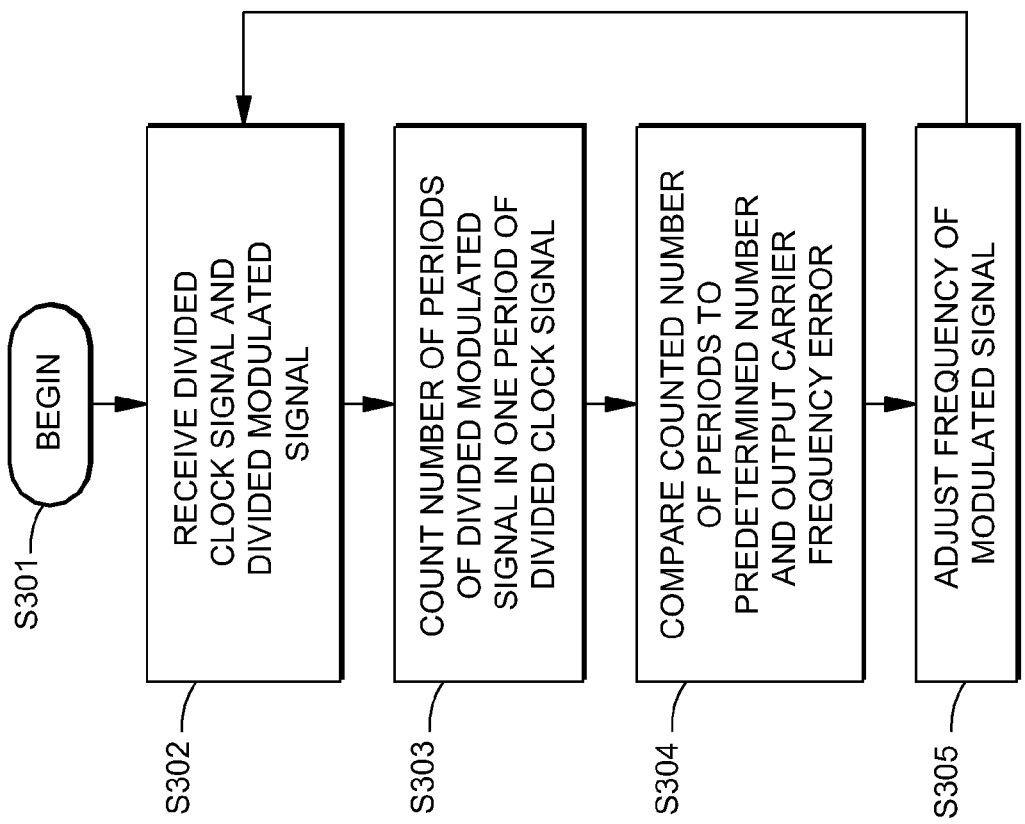
FIG. 12 is a flow chart depicting a process of locking a carrier frequency in accordance with the example embodiments.

FIG. 12 is a flow chart depicting a process of locking a carrier frequency in accordance with the embodiments described herein. In block S301, the process begins. In block S302, a divided clock signal and a divided modulated signal are received. In block S303, a number of periods of the divided modulated signal within one period of the divided clock signal is counted. In other embodiments, a number of periods of the divided modulated signal within multiple periods of the divided clock signal may be counted. In block S304, the counted number of periods (clock cycles) is compared to a predetermined number, and a carrier frequency error is produced. In block S305, a frequency of a carrier component of the modulated signal is adjusted based on the carrier frequency error. By this method, the frequency of the carrier component of the modulated signal is locked.

Third Embodiment

Figure 13:
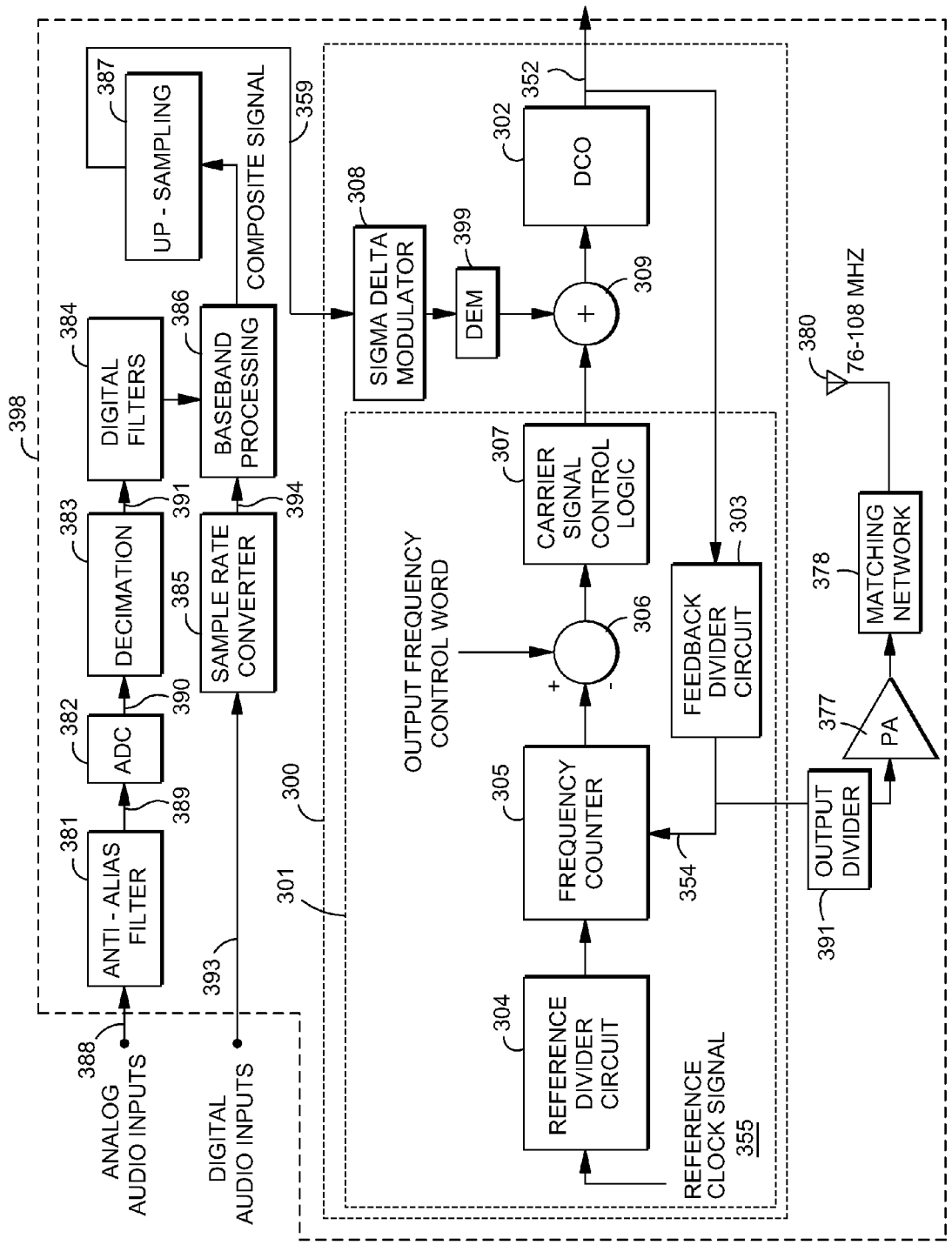
FIG. 13 is a block diagram of an FM transmitter device in accordance with a third example embodiment.

FIG. 13 is a block diagram of a third embodiment of an FM transmitter circuit 300 in an FM transmitter device 398. FM transmitter device 398 includes anti-alias filter 381, analog-to-digital (AD) converter 382, decimation circuit 383, digital filters 384, sample rate converter 385, baseband processing circuit 386, up-sampling circuit 387, FM transmitter circuit 300, output divider 391, power amplifier (PA) 377, matching network 378, and antenna 380.

FM transmitter circuit 300 includes DCO 302, DFLL control logic circuit 301, adder circuit 309, dynamic element matching (DEM) circuit 399 and sigma delta modulator circuit 308. DFLL control logic circuit 301 includes reference divider circuit 304, feedback divider circuit 303, frequency counter circuit 305, comparison circuit 306 and carrier signal control logic circuit 307.

FM transmitter device 398 receives both analog audio input 388 and digital audio input 393. An analog audio signal input on analog audio input 388 undergoes processing in anti-alias filter 381, AD converter 382, decimation circuit 383, digital filters 384, baseband processing circuit 386, and up-sampling circuit 387 before arriving as input signal 359 at FM transmitter circuit 300. A digital audio signal input on digital audio input 393 undergoes processing in sample rate converter 385, baseband processing circuit 386 and up-sampling circuit 387 before arriving as input signal 359 at FM transmitter circuit 300. Divided modulated signal 354 is processed by output divider 391, PA 377 and matching network 378 before arriving at antenna 380.

Anti-alias filter 381 restricts the bandwidth of an analog audio signal to a range satisfactory for AD conversion. AD converter 382 converts an analog output 389 of anti-alias filter 381 into a digital signal. Decimation circuit 383 reduces the number of samples in the digital signal 390 output from AD converter 382 and produces decimated signal 391. Digital filters 384 perform various types of processing on decimated signal 391. Sample rate converter 385 changes the sample rate of the signal received at digital audio input 393. If FM transmitter device 398 is operating using an analog input signal, baseband processing circuit 386 shifts the range of frequencies spanned by an output of the digital filters 384 to a range that is more easily processed by FM transmitter circuit 300. If FM transmitter device 398 is operating using a digital input signal, baseband processing circuit 386 shifts the range of frequencies spanned by output 394 of the sample rate converter to a range that is more easily processed by FM transmitter circuit 300. Up-sampling circuit 387 increases the number of samples in an output of baseband processing circuit 386 and performs interpolation on the resulting signal. An output of up-sampling circuit 387 is input signal 359 to FM transmitter circuit 300.

This third embodiment includes DEM circuit 389 after sigma delta modulator circuit 308. DEM circuit 389 pushes non-linearity effects out of a band of DCO 302 such that the non-linearity effects do not distort modulated signal 352.

In this embodiment, the output of FM transmitter circuit 300 is divided modulated signal 354. A frequency of the output of FM transmitter circuit 300 is divided again by output divider 391.

Matching network 378 matches the impedance of PA circuit 377 to the impedance of antenna 380 to maximize power transfer and minimize reflections. Antenna 380 broadcasts an FM signal in the range of 76 MHz to 108 MHz.

Other Embodiments

Figure 14A:
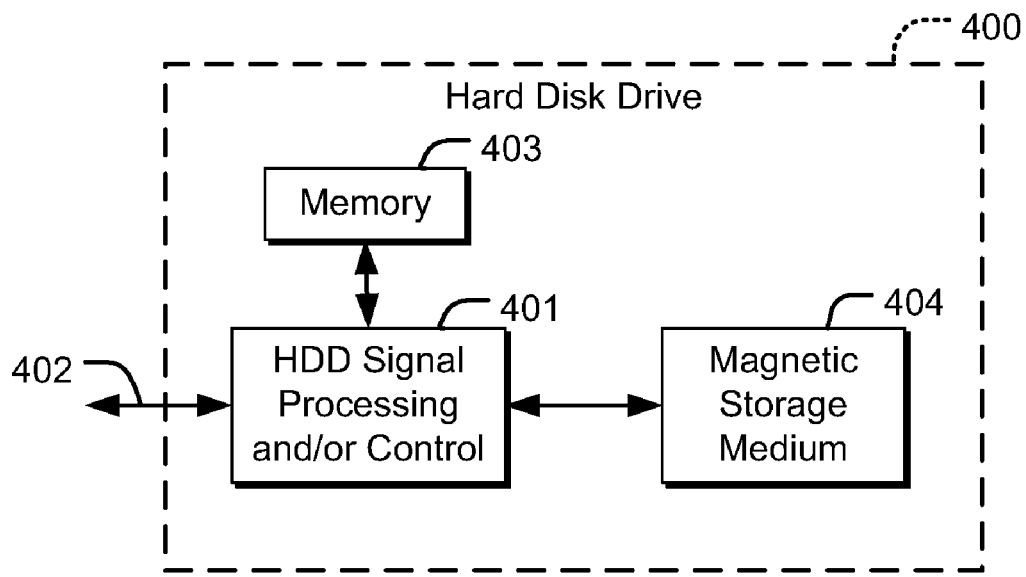
FIG. 14A is a diagram of an embodiment in a hard disk drive.

Referring now to FIGS. 14A to 14H, various exemplary implementations of the present invention are shown. Referring to FIG. 14A, the present invention may be embodied as an FM transmitter circuit in a hard disk drive (HDD) 400. The embodiment of the present invention may implement either or both signal processing and/or control circuits, which are generally identified in FIG. 14A at 401. In some implementations, signal processing and/or control circuit 401 and/or other circuits (not shown) in HDD 400 may process data, perform coding and/or encryption, perform calculations, and/or or format data that is output to and/or received from a magnetic storage medium 404.

HDD 400 may communicate with a host device (not shown) such as a computer, mobile computing devices such as personal digital assistants, cellular phones, media or MP3 players and the like, and/or other devices via one or more wired or wireless communication links 402. HDD 400 may be connected to memory 403, such as random access memory (RAM), a low latency nonvolatile memory such as flash memory, read only memory (ROM) and/or other suitable electronic data storage.

Figure 14B:
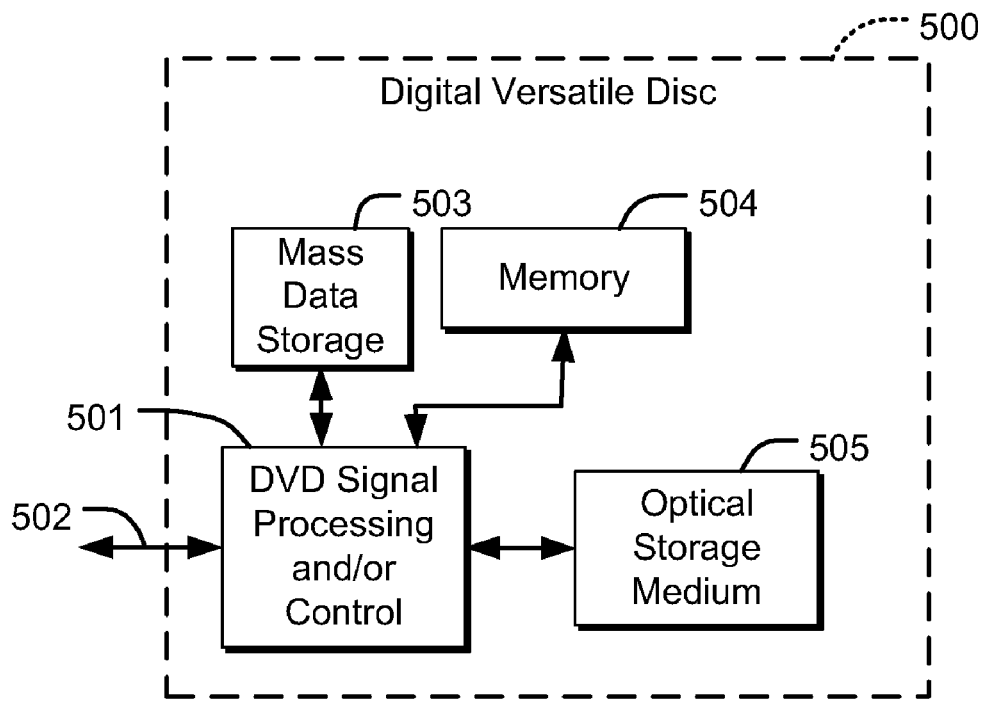
FIG. 14B is a diagram of an embodiment in a DVD drive.

Referring now to FIG. 14B, the present invention may be embodied as an FM transmitter circuit in a digital versatile disc (DVD) drive 500. The embodiment of the present invention may implement either or both signal processing and/or control circuits, which are generally identified in FIG. 14B at 501, and/or mass data storage 503 of DVD drive 500. Signal processing and/or control circuit 501 and/or other circuits (not shown) in DVD drive 500 may process data, perform coding and/or encryption, perform calculations, and/or format data that is read from and/or data written to an optical storage medium 505. In some implementations, signal processing and/or control circuit 501 and/or other circuits (not shown) in DVD drive 500 can also perform other functions such as encoding and/or decoding and/or any other signal processing functions associated with a DVD drive.

DVD drive 500 may communicate with an output device (not shown) such as a computer, television or other device via one or more wired or wireless communication links 502. DVD drive 500 may communicate with mass data storage 503 that stores data in a nonvolatile manner. Mass data storage 503 may include a hard disk drive (HDD) such as that shown in FIG. 14A. The HDD may be a mini HDD that includes one or more platters having a diameter that is smaller than approximately 1.8". DVD drive 500 may be connected to memory 504, such as RAM, ROM, low latency nonvolatile memory such as flash memory, and/or other suitable electronic data storage.

Figure 14C:
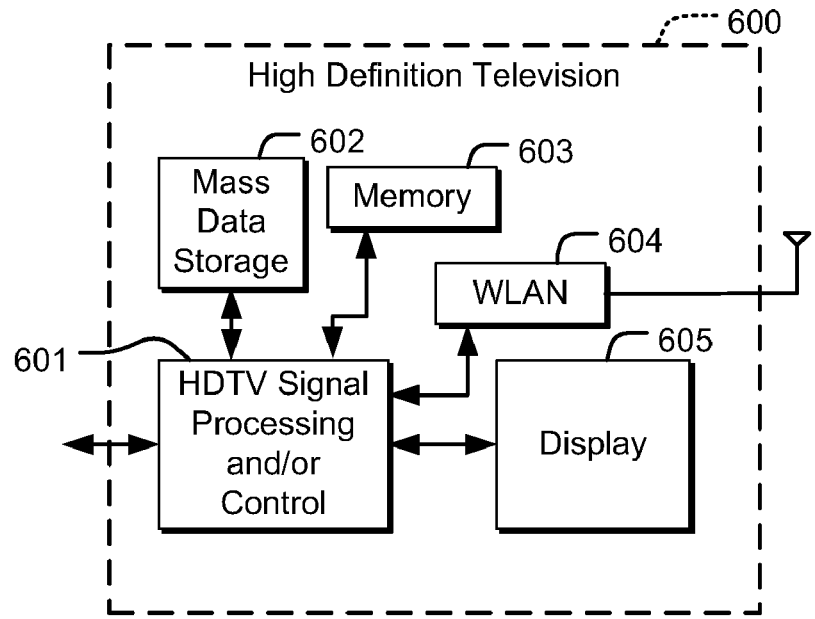
FIG. 14C is a diagram of an embodiment in a high definition television (HDTV).

Referring now to FIG. 14C, the present invention may be embodied as an FM transmitter circuit in a high definition television (HDTV) 600. The embodiment of the present invention may implement either or both signal processing and/or control circuits, which are generally identified in FIG. 14C at 601, a WLAN interface and/or mass data storage of the HDTV 600. HDTV 600 receives HDTV input signals in either a wired or wireless format and generates HDTV output signals for a display 605. In some implementations, signal processing circuit and/or control circuit 601 and/or other circuits (not shown) of HDTV 600 may process data, perform coding and/or encryption, perform calculations, format data and/or perform any other type of HDTV processing that may be required.

HDTV 600 may communicate with mass data storage 602 that stores data in a nonvolatile manner such as optical and/or magnetic storage devices (e.g., a HDD and/or DVD drive). At least one HDD may have the configuration shown in FIG. 14A and/or at least one DVD drive may have the configuration shown in FIG. 14B. The HDD may be a mini HDD that includes one or more platters having a diameter that is smaller than approximately 1.8". HDTV 600 may be connected to memory 603 such as RAM, ROM, low latency nonvolatile memory such as flash memory and/or other suitable electronic data storage. HDTV 600 also may support connections with a WLAN via a WLAN interface 604.

Figure 14D:
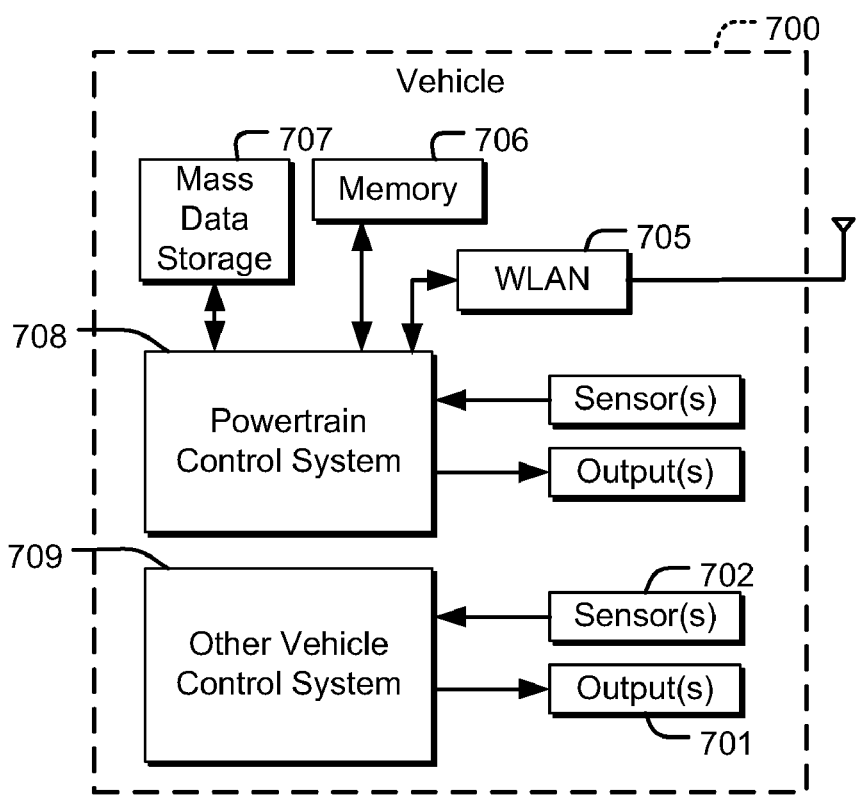
FIG. 14D is a diagram of an embodiment in a vehicle.

Referring now to FIG. 14D, the present invention may be embodied as an FM transmitter circuit in a control system of a vehicle 700, a WLAN interface and/or mass data storage of the vehicle control system. In some implementations, the embodiment of the present invention implements a powertrain control system 708 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 709 of vehicle 700. Control system 709 may likewise receive signals from input sensors 702 and/or output control signals to one or more output devices 701. In some implementations, control system 709 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 708 may communicate with mass data storage 707 that stores data in a nonvolatile manner. Mass data storage 707 may include optical and/or magnetic storage devices for example hard disk drives HDD and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Powertrain control system 708 may be connected to memory 706 such as RAM, ROM, low latency nonvolatile memory such as flash memory and/or other suitable electronic data storage. Powertrain control system 708 also may support connections with a WLAN via a WLAN interface 705. The control system 709 may also include mass data storage, memory and/or a WLAN interface (all not shown).

Figure 14E:
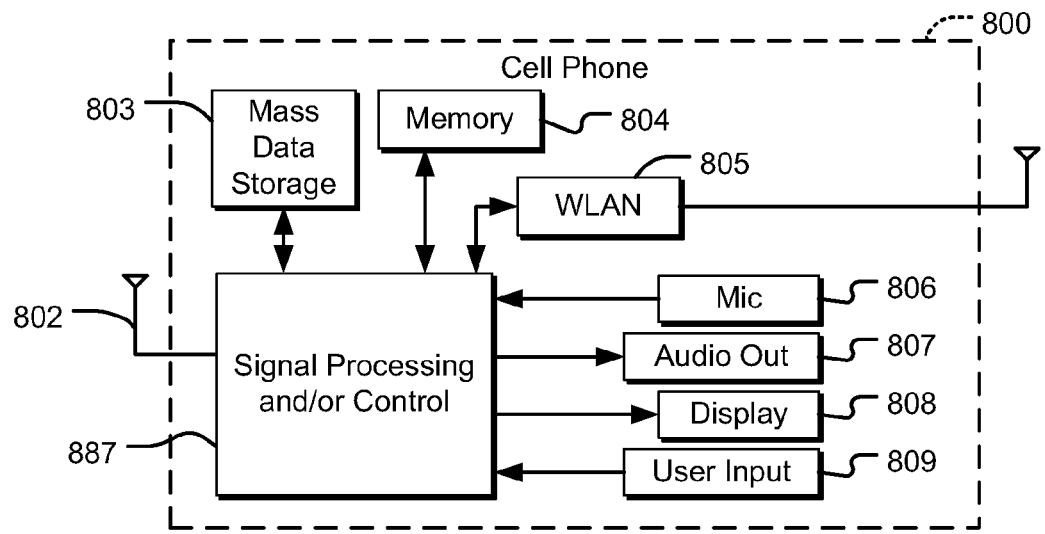
FIG. 14E is a diagram of an embodiment in a cellular or mobile phone.

Referring now to FIG. 14E, the present invention may be embodied as an FM transmitter circuit in a cellular phone 800 that may include a cellular antenna 802. The embodiment of the present invention may implement either or both signal processing and/or control circuits, which are generally identified in FIG. 14E at 887, a WLAN interface and/or mass data storage of the cellular phone 800. In some implementations, cellular phone 800 includes a microphone 806, an audio output 807 such as a speaker and/or audio output jack, a display 808 and/or an input device 809 such as a keypad, pointing device, voice actuation and/or other input device. Signal processing and/or control circuits 808 and/or other circuits (not shown) in cellular phone 800 may process data, perform coding and/or encryption, perform calculations, format data and/or perform other cellular phone functions.

Cellular phone 800 may communicate with mass data storage 803 that stores data in a nonvolatile manner such as optical and/or magnetic storage devices for example hard disk drives HDD and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Cellular phone 800 may be connected to memory 804 such as RAM, ROM, low latency nonvolatile memory such as flash memory and/or other suitable electronic data storage. Cellular phone 800 also may support connections with a WLAN via a WLAN interface 805.

Figure 14F:
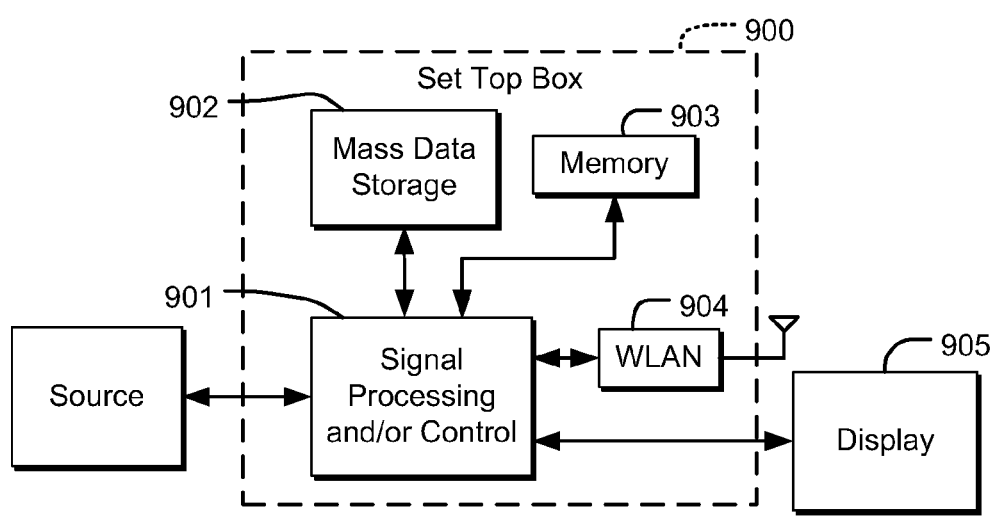
FIG. 14F is a diagram of an embodiment in a set top box.

Referring now to FIG. 14F, the present invention may be embodied as an FM transmitter circuit in a set top box 900. The embodiment of the present invention may implement either or both signal processing and/or control circuits, which are generally identified in FIG. 14F at 901, a WLAN interface and/or mass data storage of the set top box 900. Set top box 900 receives signals from a source such as a broadband source and outputs standard and/or high definition audio/video signals suitable for a display 905 such as a television and/or monitor and/or other video and/or audio output devices. Signal processing and/or control circuits 901 and/or other circuits (not shown) of the set top box 900 may process data, perform coding and/or encryption, perform calculations, format data and/or perform any other set top box function.

Set top box 900 may communicate with mass data storage 902 that stores data in a nonvolatile manner. Mass data storage 902 may include optical and/or magnetic storage devices for example hard disk drives HDD and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Set top box 900 may be connected to memory 903 such as RAM, ROM, low latency nonvolatile memory such as flash memory and/or other suitable electronic data storage. Set top box 900 also may support connections with a WLAN via a WLAN interface 904.

Figure 14G:
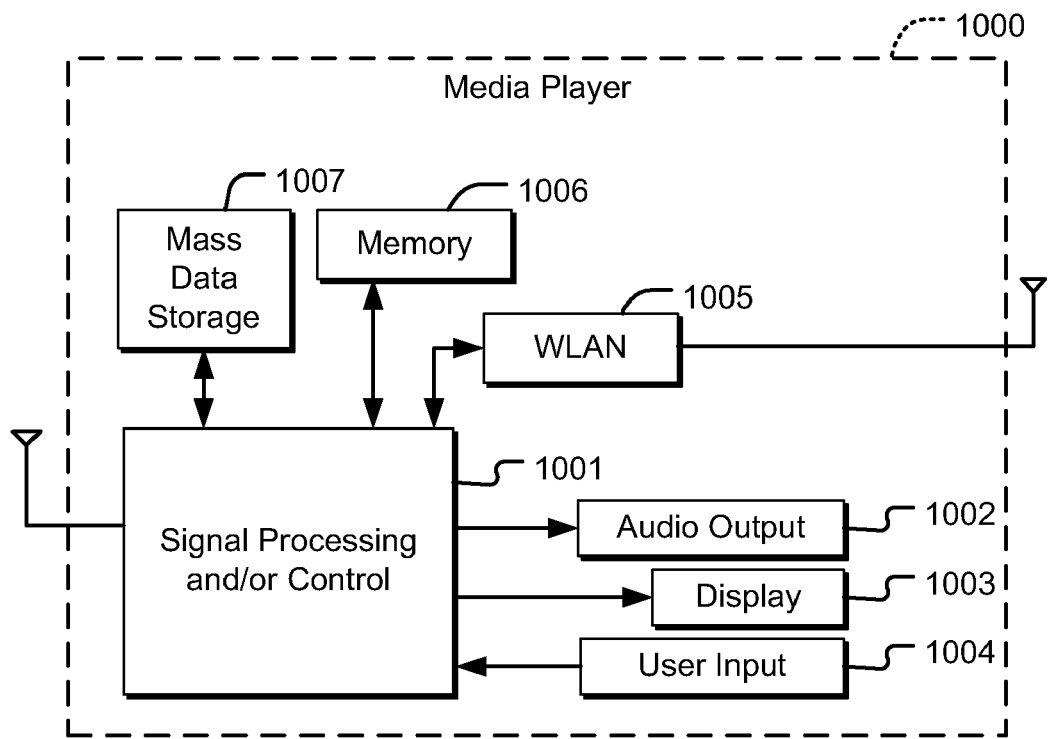
FIG. 14G is a diagram of an embodiment in a media player.

Referring now to FIG. 14G, the present invention may be embodied as an FM transmitter circuit in a media player 1000. The embodiment of the present invention may implement either or both signal processing and/or control circuits, which are generally identified in FIG. 14G at 1001, a WLAN interface and/or mass data storage of the media player 1000. In some implementations, media player 1000 includes a display 1003 and/or a user input 1004 such as a keypad, touchpad and the like. In some implementations, media player 1000 may employ a graphical user interface (GUI) that typically employs menus, drop down menus, icons and/or a point-and-click interface via display 1003 and/or user input 1004. Media player 1000 further includes an audio output 1002 such as a speaker and/or audio output jack. Signal processing and/or control circuits 1001 and/or other circuits (not shown) of media player 1000 may process data, perform coding and/or encryption, perform calculations, format data and/or perform any other media player function.

Media player 1000 may communicate with mass data storage 1007 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". Media player 1000 may be connected to memory 1006 such as RAM, ROM, low latency nonvolatile memory such as flash memory and/or other suitable electronic data storage. Media player 1000 also may support connections with a WLAN via a WLAN interface 1005. Still other implementations in addition to those described above are contemplated.

Figure 14H:
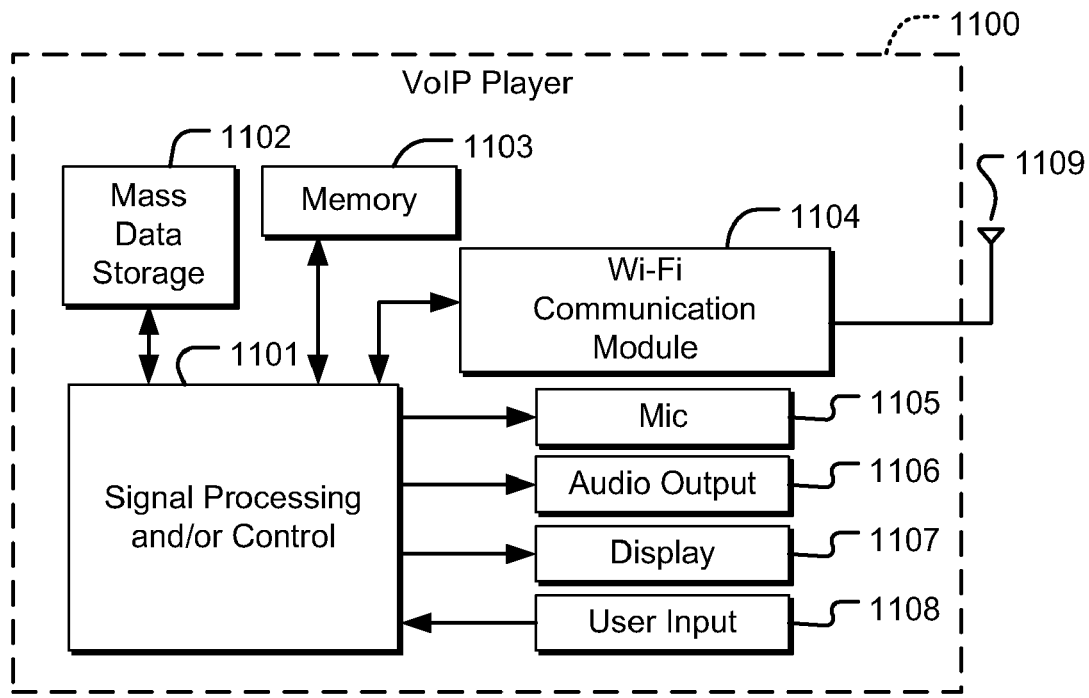
FIG. 14H is a diagram of an embodiment in a VoIP phone.

Referring to FIG. 14H, the present invention may be embodied as an FM transmitter circuit in a Voice over Internet Protocol (VoIP) phone 1100 that may include an antenna 1109. The embodiment of the present invention may implement either or both signal processing and/or control circuits, which are generally identified in FIG. 14H at 1101, a wireless interface and/or mass data storage of the VoIP phone 1102. In some implementations, VoIP phone 1100 includes, in part, a microphone 1105, an audio output 1106 such as a speaker and/or audio output jack, a display monitor 1107, an input device 1108 such as a keypad, pointing device, voice actuation and/or other input devices, and a Wireless Fidelity (Wi-Fi) communication module 1104. Signal processing and/or control circuits 1101 and/or other circuits (not shown) in VoIP phone 1100 may process data, perform coding and/or encryption, perform calculations, format data and/or perform other VoIP phone functions.

VoIP phone 1100 may communicate with mass data storage 1102 that stores data in a nonvolatile manner such as optical and/or magnetic storage devices, for example hard disk drives HDD and/or DVD drives. At least one HDD may have the configuration shown in FIG. 14A and/or at least one DVD drive may have the configuration shown in FIG. 14B. The HDD may be a mini HDD that includes one or more platters having a diameter that is smaller than approximately 1.8". VoIP phone 1100 may be connected to memory 1103, which may be a RAM, ROM, low latency nonvolatile memory such as flash memory and/or other suitable electronic data storage. VoIP phone 1100 is configured to establish communications link with a VoIP network (not shown) via Wi-Fi communication module 1104.

The invention has been described above with respect to particular illustrative embodiments. It is understood that the invention is not limited to the above-described embodiments and that various changes and modifications may be made without departing from the scope of the invention. For example, one or more steps of methods described above can be performed concurrently or in a different order to achieve desirable results.

What is claimed is:

1. A circuit for frequency modulation (FM) transmission of an input signal, the circuit comprising:
    a digitally controlled oscillator (DCO) that outputs a modulated signal whose frequency is controlled by a digital tuning word;
    a digital frequency-locked-loop (DFLL) control logic circuit that generates a carrier signal word;
    a sigma delta modulator circuit that dithers the input signal to generate a dithered input signal word; and
    an adder circuit that sums the carrier signal word and the dithered input signal word to generate the digital tuning word,
    wherein the DFLL control logic circuit is constructed to adjust the carrier signal word based on a feedback of the modulated signal such that a carrier frequency of the modulated signal is locked.

2. The circuit of claim 1, wherein the DFLL control logic circuit comprises:
    a carrier signal control logic circuit that generates the carrier signal word;
    a feedback divider circuit that receives the feedback of the modulated signal and outputs a divided modulated signal;
    a reference divider circuit that receives a reference clock signal and outputs a divided clock signal;
    a frequency counter circuit that receives the divided modulated signal and the divided clock signal, counts a number of clock cycles of the divided modulated signal during a fixed period, and outputs the counted number of clock cycles, wherein the fixed period is determined by the divided clock signal; and
    a comparison circuit that compares the counted number of clock cycles to a predetermined number of clock cycles, and outputs a carrier frequency error,
    wherein the carrier signal control logic circuit is constructed to receive the carrier frequency error, and to adjust the carrier signal word based on the received carrier frequency error, so that a carrier frequency of the modulated signal is locked.

3. The circuit of claim 1, wherein the DCO includes a large number of varactors connected in parallel with an inductor, wherein the varactors are controlled by the digital tuning word.

4. The circuit of claim 2, wherein the feedback divider circuit is a frequency divider, and the divided modulated signal has a frequency equal to a frequency of the modulated signal divided by a feedback divisor of the feedback divider circuit.

5. The circuit of claim 2, wherein the reference divider circuit is a frequency divider, and the divided clock signal has a frequency equal to a frequency of the clock signal divided by a reference divisor of the reference divider circuit.

6. The circuit of claim 2, wherein the comparison circuit receives an output frequency control word that specifies the predetermined number of clock cycles.

7. The circuit of claim 1, wherein the circuit is constructed on a CMOS chip.

8. A circuit for frequency modulation (FM) transmission of an input signal, the circuit comprising:
    a digitally controlled oscillator (DCO) that outputs a modulated signal whose frequency is controlled by a digital tuning word;
    a carrier signal control logic circuit that generates a carrier signal word having most significant bits (MSB) and least significant bits (LSB);
    an LSB adder circuit that sums the LSB and the input signal to generate an LSB-input signal;
    a sigma delta modulator circuit that dithers the LSB-input signal to generate a dithered input signal word;
    an adder circuit that sums the MSB and the dithered input signal word to generate the digital tuning word;
    a feedback divider circuit that receives a feedback of the modulated signal and outputs a divided modulated signal;
    a reference divider circuit that receives a reference clock signal and outputs a divided clock signal;
    a frequency counter circuit that receives the divided modulated signal and the divided clock signal, counts a number of clock cycles of the divided modulated signal during a fixed period, and outputs the counted number of clock cycles, wherein the fixed period is determined by the divided clock signal; and
    a comparison circuit that compares the counted number of clock cycles to a predetermined number of clock cycles, and outputs a carrier frequency error,
    wherein the carrier signal control logic circuit is constructed to receive the carrier frequency error, and to adjust the carrier signal word based on the received carrier frequency error such that a carrier frequency of the modulated signal is locked.

9. The circuit of claim 8, wherein the DCO includes a large number of varactors connected in parallel with an inductor, wherein the varactors are controlled by the digital tuning word.

10. The circuit of claim 8, wherein the feedback divider circuit is a frequency divider, and the divided modulated signal has a frequency equal to a frequency of the modulated signal divided by a feedback divisor of the feedback divider circuit.

11. The circuit of claim 8, wherein the reference divider circuit is a frequency divider, and the divided clock signal has a frequency equal to a frequency of the clock signal divided by a reference divisor of the reference divider circuit.

12. The circuit of claim 8, wherein the comparison circuit receives an output frequency control word that specifies the predetermined number of clock cycles.

13. The circuit of claim 8, wherein the circuit is constructed on a CMOS chip.

14. A method for frequency modulation (FM) transmission of an input signal, the method comprising:
- a signal generating step of outputting a modulated signal whose frequency is controlled by a digital tuning word;
- a frequency locking controlling step of generating a carrier signal word and adjusting the carrier signal word based on a feedback of the modulated signal such that a carrier frequency of the modulated signal is locked;
- a sigma delta modulating step of dithering the input signal to generate a dithered input signal word; and
- an adding step of summing the carrier signal word and the dithered input signal word to generate the digital tuning word.

15. The method of claim 14, wherein the frequency locking controlling step comprises:
- a carrier signal controlling step of generating the carrier signal word;
- a feedback dividing step of receiving the feedback of the modulated signal and outputting a divided modulated signal;
- a reference dividing step of receiving a reference clock signal and outputting a divided clock signal;
- a frequency counting step of receiving the divided modulated signal and the divided clock signal, counting a number of clock cycles of the divided modulated signal during a fixed period, and outputting the counted number of clock cycles, wherein the fixed period is determined by the divided clock signal; and
- a comparing step of comparing the counted number of clock cycles to a predetermined number of clock cycles, and outputting a carrier frequency error,
- wherein the carrier signal controlling step adjusts the carrier signal word based on the carrier frequency error such that a carrier frequency of the modulated signal is locked.

16. The method of claim 15, wherein the divided modulated signal has a frequency equal to a frequency of the modulated signal divided by a feedback divisor.

17. The method of claim 15, wherein the divided clock signal has a frequency equal to a frequency of the clock signal divided by a reference divisor.

18. The method of claim 15, wherein the predetermined number of clock cycles is specified by an output frequency control word.

19. A method for frequency modulation (FM) transmission of an input signal, the method comprising:
- a signal generating step of outputting a modulated signal whose frequency is controlled by a digital tuning word;
- a carrier signal controlling step of generating a carrier signal word having most significant bits (MSB) and least significant bits (LSB);
- an LSB adding step of summing the LSB and the input signal to generate an LSB-input signal;
- a sigma delta modulating step of dithering the LSB-input signal to generate a dithered input signal word;
- an adding step of summing the MSB and the dithered input signal word to generate the digital tuning word;
- a feedback dividing step of receiving a feedback of the modulated signal and outputting a divided modulated signal;
- a reference dividing step of receiving a reference clock signal and outputting a divided clock signal;
- a frequency counting step of receiving the divided modulated signal and the divided clock signal, counting a number of clock cycles of the divided modulated signal during a fixed period, and outputting the counted number of clock cycles, wherein the fixed period is determined by the divided clock signal; and
- a comparing step of comparing the counted number of clock cycles to a predetermined number of clock cycles, and outputting a carrier frequency error,
- wherein the carrier signal controlling step adjusts the carrier signal word based on the carrier frequency error such that a carrier frequency of the modulated signal is locked.

20. The method of claim 19, wherein the divided modulated signal has a frequency equal to a frequency of the modulated signal divided by a feedback divisor.

21. The method of claim 19, wherein the divided clock signal has a frequency equal to a frequency of the clock signal divided by a reference divisor of the reference division step.

22. The method of claim 19, wherein the predetermined number of clock cycles is specified by an output frequency control word.

* * * * *